US009201986B1

(12) United States Patent
Mirtich et al.

(10) Patent No.: US 9,201,986 B1
(45) Date of Patent: Dec. 1, 2015

(54) MANAGING DYNAMIC STATE OF A PHYSICAL SYSTEM

(75) Inventors: Brian Mirtich, Phoenix, AZ (US); Jeffrey Wendlandt, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 39 days.

(21) Appl. No.: 13/109,676

(22) Filed: May 17, 2011

Related U.S. Application Data

(63) Continuation-in-part of application No. 12/837,638, filed on Jul. 16, 2010, now Pat. No. 8,380,467.

(60) Provisional application No. 61/394,198, filed on Oct. 18, 2010.

(51) Int. Cl.
*G06F 17/50* (2006.01)

(52) U.S. Cl.
CPC ..................................... *G06F 17/50* (2013.01)

(58) Field of Classification Search
CPC .... G05B 19/41885; G05B 17/00; G06T 1/00; G06T 19/00; G06F 17/50; G06F 17/5009; G06F 2217/06; G06F 11/3608
USPC .......... 717/104, 135, 114, 137; 703/6, 7, 8, 1, 703/2; 716/106; 706/920; 715/239; 707/760; 606/130
See application file for complete search history.

(56) References Cited

U.S. PATENT DOCUMENTS

| | | | |
|---|---|---|---|
| 4,479,196 A * | 10/1984 | Ferrer et al. ........................... | 1/1 |
| 4,965,743 A * | 10/1990 | Malin et al. ...................... | 706/45 |
| 5,331,579 A * | 7/1994 | Maguire et al. .................... | 703/2 |
| 5,485,600 A | 1/1996 | Joseph et al. | |
| 5,566,295 A * | 10/1996 | Cypher ............... | G06F 17/5009 703/13 |
| 5,611,031 A | 3/1997 | Hertzfeld et al. | |
| 5,757,678 A | 5/1998 | Leeke | |
| 5,768,586 A * | 6/1998 | Zweben et al. ............... | 713/100 |
| 6,069,629 A | 5/2000 | Paterson et al. | |
| 6,714,201 B1 * | 3/2004 | Grinstein et al. ............. | 345/474 |
| 6,732,296 B1 * | 5/2004 | Cherny et al. .................... | 714/32 |
| 6,957,177 B1 * | 10/2005 | Brumitt et al. ................... | 703/13 |
| 6,983,227 B1 * | 1/2006 | Thalhammer-Reyero ........ | 703/2 |
| 7,010,778 B2 * | 3/2006 | Cook ............................ | 717/106 |

(Continued)

OTHER PUBLICATIONS

Mosemann et al. "Automatic Decomposition of Planned Assembly Sequences Into Skill Primitives", IEEE Transactions on Robotics and Automation, vol. 17, No. 5, Oct. 2001, pp. 709-718.*

(Continued)

*Primary Examiner* — Gary Mui
*Assistant Examiner* — Michael Phillips
(74) *Attorney, Agent, or Firm* — Harrity & Harrity, LLP

(57) ABSTRACT

In an embodiment, a network may represent a physical system. The network may have an element that represents an entity of the physical system. A value of a state associated with the network may be identified (e.g., generated) using various techniques. The state may be a low-level state associated with the network. The techniques may include, but are not limited to, for example, generating the value based on a scaffold defined for the network, generating the value based on a target value for the state, and/or generating the value based on applying an operation to various values of the state. The identified value may be associated with an identifier. The identifier may distinguish the value, for example, from other values of other states in the network and/or other values of states in other networks.

19 Claims, 18 Drawing Sheets

(56) References Cited

U.S. PATENT DOCUMENTS

| | | | |
|---|---|---|---|
| 7,024,345 B1 | 4/2006 | Stamm et al. | |
| 7,099,809 B2 | 8/2006 | Dori | |
| 7,373,284 B2 | 5/2008 | Stabelfeldt et al. | |
| 7,676,356 B2* | 3/2010 | Carmel et al. | 703/21 |
| 7,734,659 B2* | 6/2010 | Lori | 707/802 |
| 7,840,938 B1* | 11/2010 | Pacheco et al. | 717/108 |
| 7,949,991 B1* | 5/2011 | Kuwamoto et al. | 717/100 |
| 8,112,142 B2 | 2/2012 | Alexander et al. | |
| 8,230,254 B2* | 7/2012 | Koike | 714/4.12 |
| 8,380,467 B1 | 2/2013 | Mirtich et al. | |
| 8,543,611 B1 | 9/2013 | Mirtich et al. | |
| 2003/0052919 A1* | 3/2003 | Tlaskal et al. | 345/764 |
| 2005/0071804 A1 | 3/2005 | Miserocchi | |
| 2005/0218856 A1 | 10/2005 | Okano | |
| 2005/0256686 A1 | 11/2005 | Stabelfeldt et al. | |
| 2007/0050180 A1* | 3/2007 | Dori | 703/6 |
| 2007/0073526 A1 | 3/2007 | Maebayashi et al. | |
| 2009/0140610 A1 | 6/2009 | Venkataraghavan et al. | |
| 2009/0150317 A1 | 6/2009 | Minamino et al. | |
| 2010/0295492 A1 | 11/2010 | Chakrabarti et al. | |
| 2010/0296422 A1 | 11/2010 | Ericson et al. | |
| 2010/0318480 A1 | 12/2010 | Kim et al. | |
| 2011/0040940 A1 | 2/2011 | Wells et al. | |
| 2011/0066626 A1 | 3/2011 | Dharmalingam | |
| 2011/0096880 A1 | 4/2011 | Steinbusch et al. | |
| 2011/0295391 A1* | 12/2011 | Schneider et al. | 700/87 |

OTHER PUBLICATIONS

Dynasim AB, "Dymola, Dynamic Modeling Laboratory, User's Manual, Version 5.0," (2002).

Imagine S.A., "AMESim, Version 4.2," (2004).

The MathWorks, "SimPowerSystems 5, User's Guide," Matlab & Simulink, The MathWorks Inc. (1998-2009).

The MathWorks, "SimPowerSystems 5, Reference," Matlab & Simulink, The MathWorks Inc. (1998-2009).

The MathWorks, "SimPowerSystems Release Notes," The MathWorks, Inc. (2003-2009).

Mitiguy, Paul and Woo, Michael, "Welcome to Working Model," retrieved online at http://www.workingmodel.com (2010).

The MathWorks, "SimMechanics 3, Getting Started Guide," The MathWorks, Inc. (2009).

The MathWorks, "SimMechanics 3, Reference," The MathWorks, Inc. (2009).

The MathWorks, "SimMechanics 3, User's Guide," The MathWorks, Inc. (2009).

The MathWorks, "SimMechanics Link 3, Reference," The MathWorks, Inc. (2009).

The MathWorks, "SimMechanics Link 3, User's Guide," The MathWorks, Inc. (2009).

The MathWorks, Inc., "Stateflow and Stateflow Coder for Complex Logic and State Diagram Modeling", User's Guide, Version 5, 2003, 896 pages.

Co-pending U.S. Appl. No. 13/765,300, entitled Representing Geometry of a System in a Modeling Environment, by Mirtich et al., filed Feb. 12, 2013, 55 pages.

Co-pending U.S. Appl. No. 13/109,671, entitled Managing Dynamic State of a Physical System, by Mirtich et al., filed May 17, 2011, 92 pages.

Co-pending U.S. Appl. No. 13/109,741, entitled Managing Dynamic State of a Physical System, by Mirtich et al., filed May 17, 2011, 92 pages.

* cited by examiner

MANAGING DYNAMIC STATE OF A PHYSICAL SYSTEM

RELATED APPLICATIONS

This Application claims priority to and the benefit of U.S. Provisional Patent Application No. 61/394,198, titled "MANAGING DYNAMIC STATE OF A PHYSICAL SYSTEM", which was filed on Oct. 18, 2010. Also this Application is a continuation-in-part of U.S. patent application Ser. No. 12/837,638, titled "REPRESENTING GEOMETRY OF A SYSTEM IN A MODELING ENVIRONMENT", which was filed on Jul. 16, 2010. All of the above-identified applications are hereby incorporated by reference in their entirety as though fully set forth herein.

BRIEF DESCRIPTION OF THE DRAWINGS

The accompanying drawings, which are incorporated in and constitute a part of this specification, illustrate one or more embodiments described herein and, together with the description, explain these embodiments. In the drawings.

DETAILED DESCRIPTION

Figure 1:
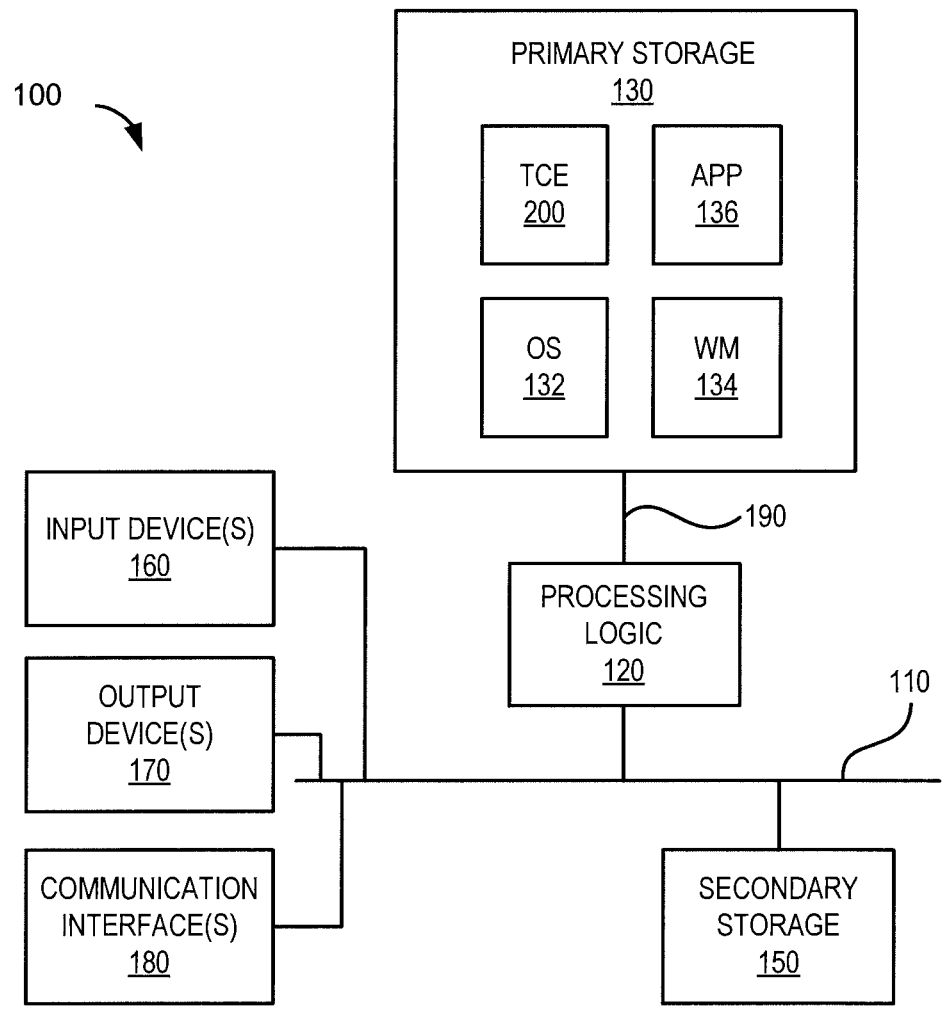
FIG. 1 illustrates a block diagram of an example of a computing device that may implement one or more embodiments of the invention.

The following detailed description refers to the accompanying drawings. The same reference numbers in different drawings may identify the same or similar features illustrated in the drawings.

One or more embodiments of the invention may be implemented on one or more computing devices. The one or more computing devices may be a system or part of a system. The one or more computing devices may include, for example, a desktop computer, laptop computer, client computer, server computer, mainframe computer, personal digital assistant (PDA), netbook computer, tablet computer, web-enabled cellular telephone, smart phone, or some other computing device.

FIG. 1 illustrates an example of a computing device 100 that may implement one or more embodiments of the invention. Referring to FIG. 1, the computing device 100 may include one or more components, such as processing logic 120, primary storage 130, secondary storage 150, one or more input devices 160, one or more output devices 170, and one or more communication interfaces 180, that may be connected together by one or more buses, such as input-output (I/O) bus 110 and memory bus 190. Note that computing device 100 is an example of a computing device that may implement one or more embodiments of the invention. Other computing devices that may be less complicated or more complicated than computing device 100 may implement one or more embodiments of the invention.

The I/O bus 110 may be an interconnect bus that may enable communication between various components in the computing device 100, such as processing logic 120, secondary storage 150, input devices 160, output devices 170, and communication interfaces 180. The communication may include, among other things, transferring information (e.g., data, control information, executable instructions) between the components.

The memory bus 190 may be an interconnect bus that may enable information to be transferred between the processing logic 120 and the primary storage 130. The information may include instructions and/or data that may be executed, manipulated, and/or otherwise processed by processing logic 120. The instructions and/or data may include instructions and/or data that may implement one or more embodiments of the invention.

The processing logic 120 may include logic that may interpret, execute, and/or otherwise process information contained in, for example, the primary storage 130 and/or secondary storage 150. The information may include computer-executable instructions and/or data that may implement one or more embodiments of the invention. The processing logic 120 may comprise a variety of heterogeneous hardware. The hardware may include, for example, some combination of one or more processors, microprocessors, field programmable gate arrays (FPGAs), application specific instruction set processors (ASIPs), application specific integrated circuits (ASICs), complex programmable logic devices (CPLDs), graphics processing units (GPUs), or other types of processing logic that may interpret, execute, manipulate, and/or otherwise process the information. The processing logic 120 may comprise a single core or multiple cores. Moreover, processing logic 120 may comprise a system-on-chip (SoC) or system-in-package (SiP). An example of a processor that may be used to implement processing logic 120 is the Intel® Xeon® processor available from Intel Corporation, Santa Clara, Calif.

The secondary storage 150 may provide a storage (e.g., a persistent storage) that is accessible to the processing logic 120 via I/O bus 110. The secondary storage 150 may store information for the processing logic 120. The information may be executed, interpreted, manipulated, and/or otherwise processed by the processing logic 120. The secondary storage 150 may comprise, for example, a storage device, such as a magnetic disk, optical disk (e.g., CD-ROM, DVD player), random-access memory (RAM) disk, tape unit, and/or flash drive. The information may be stored on one or more non-transient tangible computer-readable media contained in the storage device. This media may include, for example, magnetic discs, optical discs, magnetic tape, and/or memory devices (e.g., flash memory devices, static RAM (SRAM) devices, dynamic RAM (DRAM) devices, or other memory devices). The information may include data and/or computer-executable instructions that may implement one or more embodiments of the invention. The information may be stored in various storage entities contained in the secondary storage 150. These storage entities may include, for example, files, databases, records, tables (e.g., contained in one or more databases), or other storage entities.

Input devices 160 may include one or more devices that may be used to input information into computing device 100. Examples of devices that may be used to input information into computing device 100 may include a keyboard (e.g., hardware keyboard, software keyboard), computer mouse, microphone, camera, trackball, gyroscopic device (e.g., gyroscope), mini-mouse, touch pad, stylus, graphics tablet, touch screen, joystick (isotonic or isometric), pointing stick, accelerometer, palm mouse, foot mouse, eyeball controlled device, finger mouse, light pen, light gun, neural device, eye tracking device, gesture tracking device, steering wheel, yoke, jog dial, space ball, directional pad, dance pad, soap mouse, haptic device, tactile device, neural device, multipoint input device, discrete pointing device, or some other input device. The information may include spatial (e.g., continuous, multi-dimensional) data that may be input into computing device 100, for example, using a device such as a computer mouse. The information may also include other forms of data, such as, for example, text that may be input using a keyboard.

Output devices 170 may include one or more devices that may output information from the computing device 100. Examples of devices that may output information from the computing device 100 may include a cathode ray tube (CRT), plasma display device, light-emitting diode (LED) display device, liquid crystal display (LCD) device, vacuum florescent display (VFD) device, surface-conduction electron-emitter display (SED) device, field emission display (FED) device, haptic device, tactile device, neural stimulation device, printer (e.g., a three-dimensional (3D) printer, laser printer), speaker, video projector, volumetric display device, plotter, actuator (e.g., electrical motor) or some other output device.

Output devices 170 may be directed by, for example, the processing logic 120, to output the information from the computing device 100. The information may be presented (e.g., displayed, printed) by output devices 170. The information may include, for example, graphical user interface (GUI) elements (e.g., windows, widgets, dialog boxes, or other GUI elements), graphical representations, pictures, text, or other information that may be presented by output devices 170. Note that the information may be presented on output devices 170 in a stereoscopic view to enable, for example, a perception of depth.

Communication interfaces 180 may include one or more devices that contain logic that may (1) interface the computing device 100 with, for example, one or more communication networks and (2) enable the computing device 100 to communicate with one or more devices connected to the communication networks. An example of a communication network that may be used with computing device 100 will be described further below with respect to FIG. 14.

Communication interfaces 180 may include one or more transceiver-like mechanisms that enable the computing device 100 to communicate with devices connected to the communication networks. Communication interfaces 180 may include a built-in network adapter, network interface card (NIC), Personal Computer Memory Card International Association (PCMCIA) network card, card bus network adapter, wireless network adapter, Universal Serial Bus (USB) network adapter, modem, or other device suitable for interfacing the computing device 100 to the communication networks.

The primary storage 130 may provide a storage that is accessible to the processing logic 120 via bus 190. The primary storage 130 may be a non-transient tangible computer-readable media that may store information for processing logic 120. The information may include computer-executable instructions and/or data that may implement operating system (OS) 132, windows manager (WM) 134, an application 136 (APP), and a technical computing environment (TCE) 200. The instructions may be executed, interpreted, and/or otherwise processed by processing logic 120. The information may be stored in various storage entities contained in the primary storage 130. These entities may include, for example, files, databases, tables (e.g., contained in databases), or other storage entities.

The primary storage 130 may comprise a RAM that may include RAM devices that may store the information. The RAM devices may be volatile or non-volatile and may include, for example, one or more DRAM devices, flash memory devices, SRAM devices, zero-capacitor RAM (ZRAM) devices, twin transistor RAM (TTRAM) devices, read-only memory (ROM) devices, ferroelectric RAM (Fe-RAM) devices, magneto-resistive RAM (MRAM) devices, phase change memory RAM (PRAM) devices, or other types of RAM devices.

OS 132 may be a conventional operating system that may implement various conventional operating system functions. These functions may include, for example, scheduling one or more portions of APP 136 and/or TCE 200 to run on the processing logic 120, managing the primary storage 130, controlling access to various components associated with the computing device 100 (e.g., secondary storage 150, input devices 160, output devices 170, communication interfaces 180), and controlling access to data received and/or transmitted by these components.

Examples of operating systems that may be used to implement OS 132 include, but are not limited to, the Linux operating system, Microsoft Windows operating system, the Symbian operating system, Mac OS, Chrome OS, and the Android operating system. A version of the Linux operating system that may be used is Red Hat Linux available from Red Hat Corporation, Raleigh, N.C. Versions of the Microsoft Windows operating system that may be used include Microsoft Windows 7, Microsoft Windows Vista, Microsoft Windows Phone, and Microsoft Windows XP operating systems available from Microsoft Inc., Redmond, Wash. The Chrome OS and Android operating systems are available from Google, Inc., Mountain View, Calif. The Mac OS operating system is available from Apple Inc., Cupertino, Calif. The Symbian operating system is available from the Symbian Foundation, London, United Kingdom.

WM 134 may be a conventional window manager that may manage GUI elements, such as widgets, dialog boxes, and windows, that may be part of the OS 132, TCE 200, and APP 136. The GUI elements may be displayed on an output device 170. The WM 134 may also be configured to (1) capture one or more positions of interactions with an input device 160 and/or other data associated with the input device 160, and (2) provide the positions and/or data to, for example, OS 132, APP 136, and/or TCE 200. The positions and/or data may be provided in messages that are sent to the OS 132, APP 136, and/or TCE 200. Examples of window managers that may be used to implement WM 134 may include, but are not limited to, X windows, GNOME, Unity, Compiz, and KDE, which are often used with the Linux operating system, and window managers used with the Microsoft Windows XP, Microsoft Windows Vista, Microsoft Windows Phone, and Microsoft Windows 7 operating systems. It should be noted that other window managers or components that implement various functions associated with window managers may be used to implement WM 134.

APP 136 may be designed to perform a particular task or tasks. APP 136 may be an executable and/or interpretable version of a software application that may be written in a programming language, such as, for example, C, C++, Java, MATLAB® Language, or some other programming language. Some or all of APP 136 may be written by a user of computing device 100, supplied by a vendor, or generated by TCE 200. Some or all of APP 136 may operate under the control of OS 132. APP 136 may include computer-executable instructions and/or data that may implement one or more embodiments of the invention.

TCE 200 may be a modeling environment that may enable modeling of various systems, such as, for example, mechanical systems, electrical systems, and/or electro-mechanical systems. TCE 200 may be a graphical modeling environment, a textual modeling environment or some combination of graphical and textual modeling environments. TCE 200 may include one or more tools that may be used to build and execute networks that may represent one or more systems. The networks may comprise one or more elements that may represent, for example, one or more entities in systems represented by the networks. These entities may include, for example, bodies, joints, constraints, and forces of the systems. A system represented by a network may be simulated by executing the network. Executing a network may be performed, for example, by executing and/or interpreting code that may implement the network.

TCE 200 may automatically generate two dimensional (2-D) and/or three dimensional (3-D) visualizations of the networks. The visualizations may be animated during simulation to enable visualization of dynamics associated with systems represented by the networks. Moreover, the visualizations may be stereoscopic. Here, differences in viewpoint may be generated from a certain vantage point. TCE 200 may also contain provisions for generating code (e.g., C code, executable code) based on the networks to enable, for example, use of accelerator modes during simulation. Also, TCE 200 may contain provisions for generating layout and/or manufacturing information (e.g., machining data, STEP-NC code) based on a system's design. Some or all of TCE 200 may operate under the control of OS 132. TCE 200 may include computer-executable instructions and/or data that may implement one or more embodiments of the invention.

Figure 2:
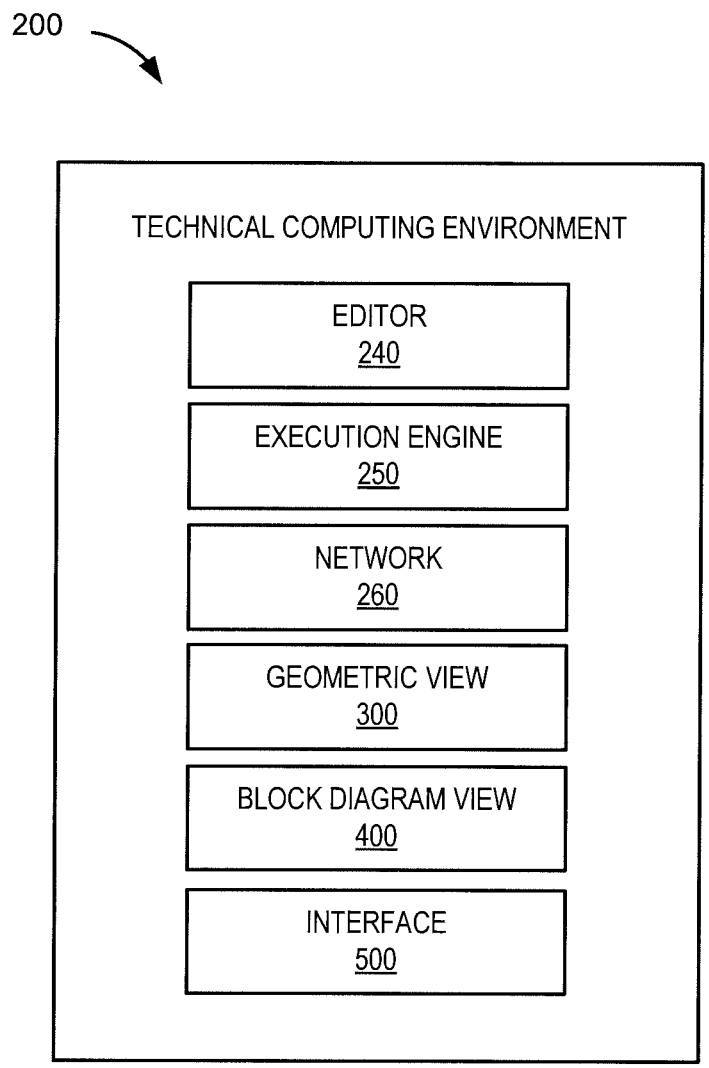
FIG. 2 illustrates a block diagram of an example of a technical computing environment (TCE) that may implement one or more embodiments of the invention.

FIG. 2 illustrates an example embodiment of TCE 200. Referring to FIG. 2, TCE 200 may comprise various components, which may include an editor 240, an execution engine 250, a network 260, a geometric view 300, a block diagram view 400, and an interface 500. Note that FIG. 2 illustrates an example embodiment of TCE 200. Other embodiments of TCE 200 may contain, for example, more components or fewer components than the components illustrated in FIG. 2. Moreover, in other embodiments of TCE 200, functions performed by the various components contained in TCE 200 may be distributed among the components differently, than described below.

The TCE 200 may include hardware-based and/or software-based logic, which may provide a computing environment that may allow various tasks, related to various disciplines, such as mathematics, science, engineering, mechanics, physics, medicine, business, biology, and/or finance, to be performed. The TCE 200 may include a dynamically-typed programming language (e.g., the MATLAB® language), where a data type of data may be determined at runtime.

The dynamically-typed programming language may use an array as a basic data element where the array may not require dimensioning. The array may be used to support array-based programming where an operation may apply to an entire set of values included in the array. Array-based programming may allow array-based operations to be treated as a high-level programming technique that may allow, for example, operations to be performed on entire aggregations of data without having to resort to explicit loops of individual non-array operations.

In addition, the TCE 200 may perform matrix and/or vector formulations that may be used for data analysis, data visualization, application development, simulation, modeling, and/or algorithm development. These matrix and/or vector formulations may be used in many areas, such as mathematics, science, engineering, mechanics, physics, medicine, business, biology, and/or finance.

The TCE 200 may further provide functions and/or tools for generating, for example, plots, surfaces, images, volumetric representations, or other representations. The TCE 200 may provide these functions and/or tools using toolboxes (e.g., toolboxes for signal processing, image processing, data plotting, and/or parallel processing). In addition, the TCE 200 may provide these functions as block sets. The TCE 200 may also provide these functions in other ways, such as via a library or a database.

The TCE 200 may include provisions for generating network 260 and using network 260 to simulate a system that is represented by network 260. The system represented by network 260 may be a physical system. Network 260 may contain one or more elements.

An element may represent an entity (e.g., a part) associated with the system. In addition, an element may include information associated with the entity associated with the system. For example, the system may contain a mechanical joint and the mechanical joint may be represented in a network as an element. The element may include information associated with the mechanical joint, such as, for example, geometric information, mass, mechanical degrees of freedom, direction of axes, internal friction, and/or range of motion.

Network 260 may be graphically represented as a block diagram that is provided in block diagram view 400 by TCE 200. An element of network 260 may be graphically represented as a block in the block diagram. A multidimensional geometric visualization (e.g., 2-D visualization, 3-D visualization) of network 260 may be provided by TCE 200 in geometric view 300. The geometric visualization of network 260 may be one form of a geometric representation of the system represented by network 260. Additional details of block diagram view 400 and geometric view 300 will be discussed further below.

TCE 200 may contain computer-executable instructions and data that may perform various tasks, such as, for example, (1) constructing network 260 through an interface, such as a GUI and/or a text-based interface; (2) allowing an augmentation of a pre-defined set of elements contained in network 260 with custom user-specified elements; (3) using network 260 to simulate the system represented by network 260; and (4) automatically producing, for example, deployable software systems, and/or descriptions of hardware systems that may mimic a behavior of either the entire network 260 or portions of the network 260. These deployable software systems and/or descriptions of hardware systems may allow the system, represented by network 260, to be simulated in, for example, a distributed computing environment.

Examples of TCEs that may be adapted to implement one or more embodiments of the invention may include, but are not limited to, Simulink®, Stateflow®, Simscape™, SimMechanics™, and SimEvents®, which are available from MathWorks, Inc.; Unified Modeling Language (UML); profiles associated with UML (e.g., Modeling Analysis and Real-Time Embedded Systems (MARTE), Systems Modeling Language (SysML), Avionics Architecture Description Language (AADL)); GNU Octave from the GNU Project; MATRIXx and LabView® from National Instruments; Mathematica from Wolfram Research, Inc.; Mathcad from Mathsoft Engineering & Education Inc.; Maple from Maplesoft; Extend from Imagine That, Inc.; Scilab and Scicos from The French Institution for Research in Computer Science and Control (INRIA); Modelica or Dymola from Dynasim AB; VisSim from Visual Solutions; SoftWIRE from Measurement Computing Corporation; WiT from DALSA Coreco; Advanced Design System, VEE Pro, and SystemVue from Agilent Technologies, Inc.; Vision Program Manager from PPT Vision, Inc.; Khoros from Khoral Research, Inc.; VisiQuest from Pegasus Imaging Corporation; Gedae from Gedae, Inc.; Virtuoso from Cadence Design Systems, Inc.; Rational Rose, Rhapsody, and Tau from International Business Machines (IBM), Inc.; SCADE from Esterel Technologies; Working Model 2D from Design Simulation Technologies, Inc.; Working Model from Design Simulation Technologies, Inc.; Computer Aided Three-dimensional Interactive Application (CATIA) and SolidWorks from Dassault Systems; and Ptolemy from the University of California at Berkeley.

Editor 240 may be a block diagram editor that may allow, for example, a user, to specify, edit, annotate, save, publish, and/or print a block diagram and/or visualization of network 260. For example, a block diagram of network 260 may be presented in block diagram view 400 and editor 240 may contain one or more provisions for specifying, editing, annotating, saving, publishing, and/or printing the block diagram in block diagram view 400. Likewise, for example, a geometric visualization of network 260 may be presented in geometric view 300 and editor 240 may contain one or more provisions for specifying, editing, annotating, saving, publishing, and/or printing the geometric visualization in geometric view 300. Note that editor 240 may contain provisions for specifying, editing, annotating, saving, publishing, and/or printing the block diagram and/or visualization graphically and/or textually. In addition, editor 240 may contain one or more provisions for editing code (e.g., source code), requirements, and/or tests that may be generated from or otherwise associated with network 260. Moreover, editor 240 may contain one or more provisions for specifying one or more entities contained in the system represented by network 260. The entities may be specified graphically and/or textually.

The execution engine 250 may use network 260 to simulate some or all of the system represented by network 260. The simulation may include performing various computations, associated with the system, based on information (e.g., geometry information) associated with one or more elements contained in network 260. The computations may include, but are not limited to, computations of dynamics, statics, equilibrium, mass, inertia, collision detection, collision response, and/or force fields associated with the system.

Figure 3:
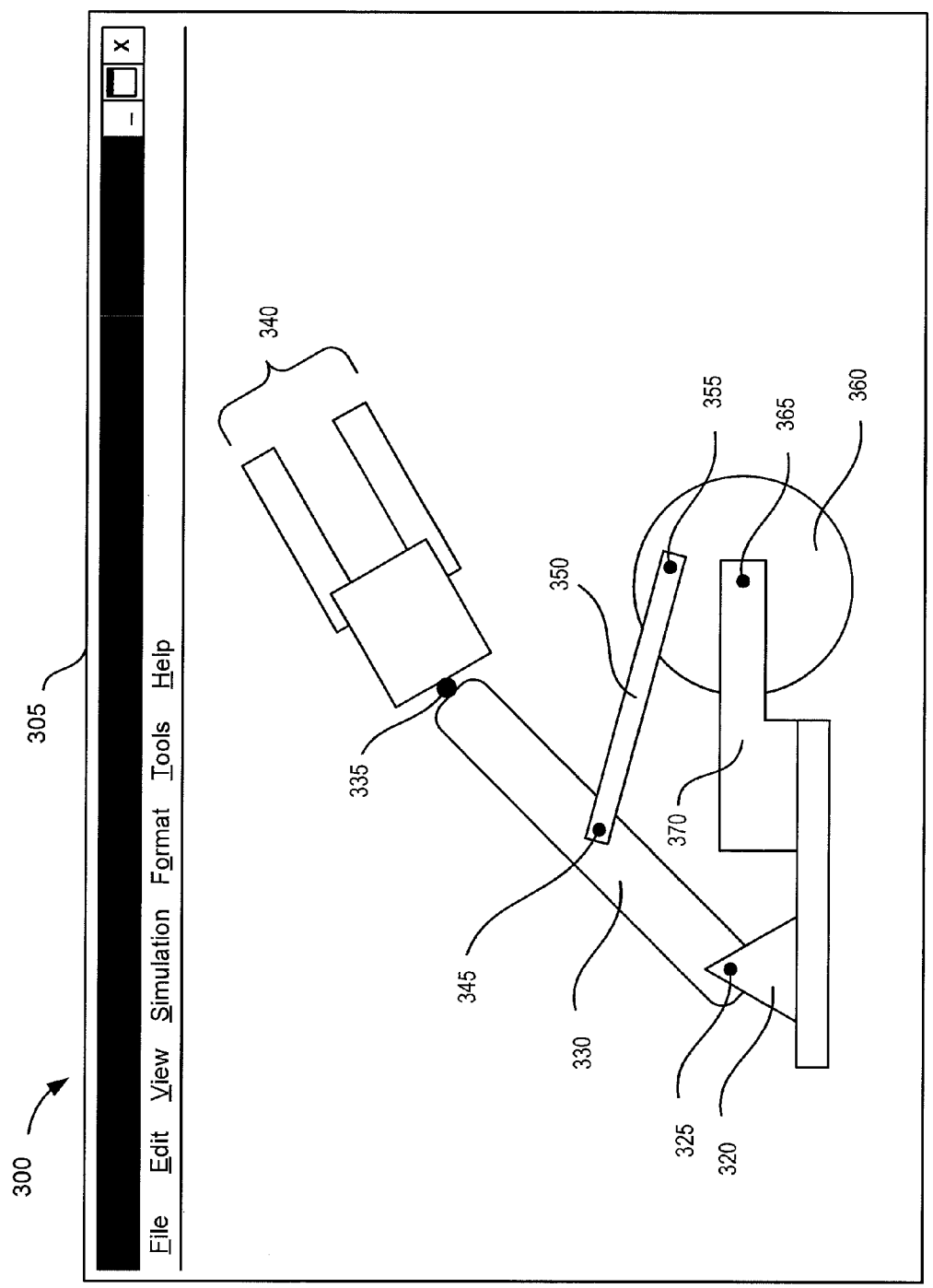
FIG. 3 illustrates an example geometric view of a visualization of a network that represents a system.

As noted above, geometric view 300 may provide a multi-dimensional geometric visualization of a network, such as network 260. FIG. 3 illustrates an example geometric view 300 that may provide a 2-D geometric visualization of a system that may be represented by an embodiment of network 260. Referring to FIG. 3, geometric view 300 may be presented in a GUI that includes a graphical window 305. The GUI may be provided (e.g., generated, displayed) by TCE 200. The window 305 may be displayed on an output device 170.

The visualization may include one or more graphical objects that may visualize one or more elements contained in the above-described embodiment of network 260. In this example, the embodiment of network 260 contains a pivot base element, pivot element, arm element, wrist element, gripper element, arm pin element, rod element, wheel pin element, wheel element, axle element, and axle base element, which may be visualized in the geometric view as graphical objects 320, 325, 330, 335, 340, 345, 350, 355, 360, 365, and 370, respectively. Note that in FIG. 3, graphical objects 320, 325, 330, 335, 340, 345, 350, 355, 360, 365, and 370 are presented in the geometric view 300 as 2-D objects. It should be noted, however, that one or more elements of a network, may be visualized in geometric view 300 as objects having other numbers of dimensions. For example, graphical objects 320, 325, 330, 335, 340, 345, 350, 355, 360, 365, and/or 370 may be presented in the geometric view 300 as 3-D objects. Also note that the orientation and position of the graphical objects 320, 325, 330, 335, 340, 345, 350, 355, 360, 365, and 370 as depicted in the geometric view 300 may be based on one or more frames associated with the objects 320, 325, 330, 335, 340, 345, 350, 355, 360, 365, and 370.

The frames may represent one or more positions and orientations that may be based on, for example, a position and orientation represented by a reference frame. For example, the pivot base element and axle base element may provide a base for the system. The base may be fixed at rest in an absolute global inertial reference frame defined by a "world" that the system resides in. Here, the base may be referred to as a "ground" for the system.

"World" may refer to a kinematic and geometric construct that may define an absolute global inertial reference frame and an absolute coordinate system. The absolute coordinate system may have a fixed origin and fixed coordinate axes that may not be changeable. The coordinate axes may be defined in three dimensions "x", "y", and "z", such that "+x" points in a rightward direction from an origin of the absolute coordinate system, "−x" points in a leftward direction from the origin, "+y" points in an upward direction from the origin, "−y" in a downward direction from the origin, and "+z" and "−z" point in opposite outward directions from the origin. Note that the origin may be an origin of the system. More information about frames and reference frames will be discussed further below.

Figure 4:
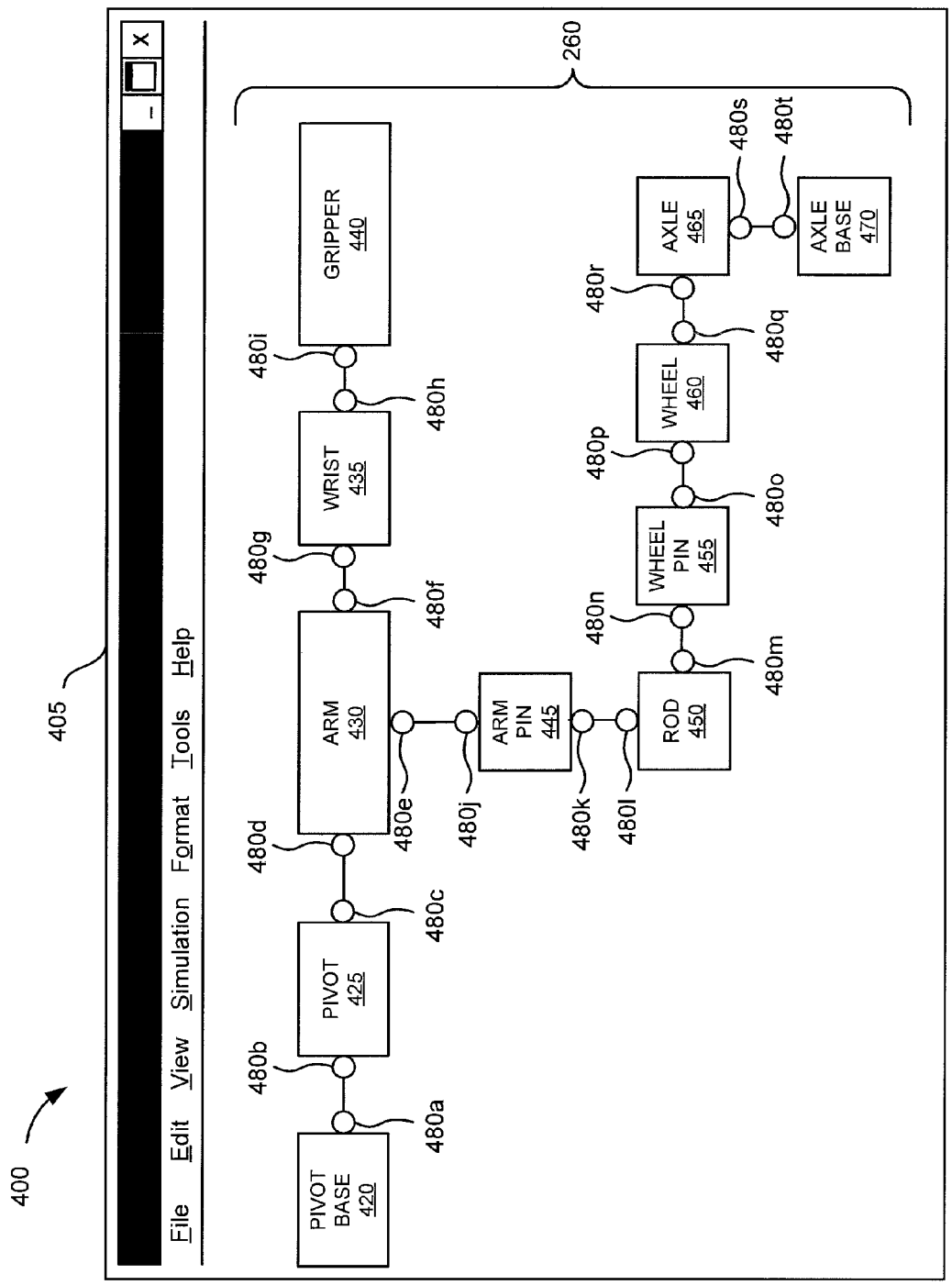
FIG. 4 illustrates an example block diagram view of a network that represents the system illustrated in FIG. 3.

FIG. 4 illustrates an example block diagram view 400 of the above-described example embodiment of network 260.

Referring to FIG. 4, the block diagram view 400 may be presented in a GUI that includes a graphical window 405. The GUI may be displayed on an output device 170 by TCE 200. The block diagram view 400 may include various blocks, such as pivot base block 420, pivot block 425, arm block 430, wrist block 435, gripper block 440, arm pin block 445, rod block, 450, wheel pin block 455, wheel block 460, axle block 465, and axle base block 470, which may represent the pivot base element, pivot element, arm element, wrist element, gripper element, arm pin element, rod element, wheel pin element, wheel element, axle element, and axle base element in network 260, respectively.

An element may include one or more frame ports that may be used to expose one or more frames associated with the element. For example, arm block 430 indicates that the arm element contains three frame ports. The frame ports are illustrated on block 430 as ports 480d-f. The frame ports may expose frames that may represent positions and orientations associated with the arm element.

A frame exposed by a frame port may represent at least a position and an orientation in a 2-D space (e.g., a space that has an x-axis and a y-axis) or 3-D space (e.g., a space that has an x-axis, a y-axis, and a z-axis) with respect to a position and orientation represented by a reference frame for a network. Moreover, a frame exposed by a frame port may represent a position and an orientation in a 2-D space or 3-D space with respect to a position and orientation represented by another frame in the network. Exposing the frame may include making one or more values that represent the position and orientation available to, for example, other elements in the network.

For example, FIG. 4 illustrates that a frame port 480e may expose a frame that represents a position and orientation associated with the arm element. A frame associated with the axle base element, which may or may not be exposed by port 480t, may act as a reference frame and the frame exposed by frame port 480e may be relative to this reference frame. Alternatively, for example, the frame exposed by port 480e may be relative to a frame exposed by frame port 480k, which exposes a frame associated with the arm pin element. Here, frame port 480k may make this reference frame available to the arm element so that the frame exposed by frame port 480e may be calculated.

A position and orientation represented by a frame may be defined by one or more parameters. The parameters may be variable. For example, one or more parameters associated with an element may be used to define one or more geometric features of an entity (e.g., length and/or width of the entity) represented by the element. The parameters may be variable in that they may be changed. The parameters may be used along with a reference frame to identify a position and orientation represented by a frame that is exposed by a frame port of the element.

It should be noted that a frame associated with an element may or may not be exposed by a frame port of the element. Moreover, a frame associated with an element may or may not lie within the geometry of an entity represented by the element. For example, a frame, exposed by frame port 480d may represent a position and orientation that lies outside the geometry of the arm element, whereas, a frame exposed by a frame port 480f may represent a position and orientation that lies within the geometry of the arm element.

One or more geometric features of an entity along with the reference frame may be used to identify a position and orientation represented by a frame. In addition, a position and orientation represented by a frame may be identified based on one or more terms of higher-level operations on geometric features of the entity. For example, a position and orientation represented by a frame may be defined in part based on a projection of a particular point feature onto a particular plane feature of the entity. Likewise, for example, a z-axis of a frame, that represents a position and an orientation in 3-D space, may be defined in part as a normalized cross product of two edge features of the entity.

A position and orientation represented by a frame may be automatically adjusted if a feature of the entity, on which the position and orientation may depend, changes. For example, an element in a network may represent a particular entity in a system. The element may include one or more parameters that represent one or more geometric features of the entity, such as, for example, a radius of the entity, a circumference of the entity, a length of the entity, a width of the entity, and/or one or more control points that define a curve of the entity. The position and orientation represented by a frame associated with the entity may change based on a change made to the one or more parameters.

Moreover, a language may be used to specify a higher-level geometric operation that may be used to identify a position and orientation represented by a frame. Here, the use of variable names in defining parameters used to identify a position and orientation represented by a frame may be one form of language that may be used. Operations specified by the language may involve, for example, identifying a normal component and/or tangential component of a vector at a point on a curve, and/or constructive solid geometry (CSG) techniques, such as finding unions and/or intersections of shapes. Note that the above techniques may be used to identify frames and/or frame relationships.

It should be noted that a network may be represented in ways other than a block diagram. For example, the network may be represented as a graph that may have one or more vertices and one or more edges. Here, the vertices may represent one or more elements in the network and the one or more edges may represent one or more frames in the network.

An element in a network may be associated with one or more states. One or more of the states may be considered low-level states. A low-level state may be a state that may represent a status, phase, situation, activity, and/or some other characteristic that may be associated with an element. For example, a low-level state that may be associated with the arm pin element, in network 260, may be a position state associated with the arm pin element. The position state may hold a value that may indicate an actual position of the arm pin element in, for example, degrees.

A state in a network (e.g., a state associated with an element in the network) may be associated with a target. A target may be specified, for example, as a value (target value). As will be described further below, the target may be specified, for example, using an interface, such as interface 500. A target associated with a state may be a suggested target or a desired target.

A suggested target may be a target value that may be used as a suggested value for the state. If the suggested target cannot be used as a value for the state, the suggested target may be used as guidance for finding a value for the state. If the suggested target can be used as a value for the state or to find a value for the state the suggested target may be considered satisfied and may be treated as feasible. Treating a suggested target as feasible may include, for example, setting the value of the state to the suggested target or a value found for the state, indicating a status that the suggested target is satisfied, and/or other actions that may be associated with treating the suggested target as feasible.

If the suggested target cannot be used as a value for the state or to find a value for the state, the suggested target may be treated as infeasible. For example, if the suggested target or an approximation of the suggested target (e.g., a value within a certain range of the suggested target) cannot be used for the state, the suggested target may be treated as infeasible. Treating a suggested target as infeasible may include, for example, ignoring the suggested target, reporting an error condition (e.g., error message, exception condition, error return code), and/or other actions that may be associated with treating the suggested target as infeasible.

For example, suppose an application programming interface (API) contains a function for specifying a suggested target for a state in a network, such as network 260. Further, suppose that the function is called with a suggested target. Now suppose that the function determines that, given various factors associated with a system represented by the network, neither the suggested target nor a close approximation thereof can be used as a value for the state. In response to this determination, the function may return an error code to the caller indicating that the suggested target is infeasible.

A desired target may be a target value that is expected to be satisfied. A desired target may have to meet certain predetermined criteria in order to be considered satisfied. The predetermined criteria may include, for example, that the desired target as specified is an acceptable value for the associated state. Note that other criteria may be used to determine whether a desired target is satisfied. If a desired target can be satisfied, the desired target may be treated as feasible. Treating the desired target as feasible may include setting the value of the state to the desired target, displaying an indication that the desired target is satisfied, and/or other actions that may be associated with treating the desired target as feasible. Failure to satisfy a desired target may cause the desired target to be treated as infeasible. Treating the desired target as infeasible may include, for example, ignoring the desired target value, reporting an error condition, and/or other actions that may be associated with treating the desired target as infeasible.

For example, suppose the wrist element in network 260, illustrated in FIG. 4, is associated with a position state. Further suppose that the position state may hold a value from 0 to 90. Now suppose a target value of 180 is specified as a desired target for the state. Since the specified desired target is outside the range of values that the state may hold (i.e., 0 to 90), the TCE 200 may find that the specified desired target cannot be satisfied. In response to finding that the desired target cannot be satisfied, the TCE 200 may treat the specified desired target as infeasible and report an error condition.

Now suppose instead of a target value of 180, a target value of 45 is specified as a desired target for the state. The TCE 200 may find that the specified desired target can be satisfied because the specified desired target value is within the range of values that the state may hold. The TCE 200 may further treat the specified desired target value as feasible. In treating the specified desired target as feasible, the TCE 200 may, for example, set the value of the state to the specified desired target.

Figure 5:
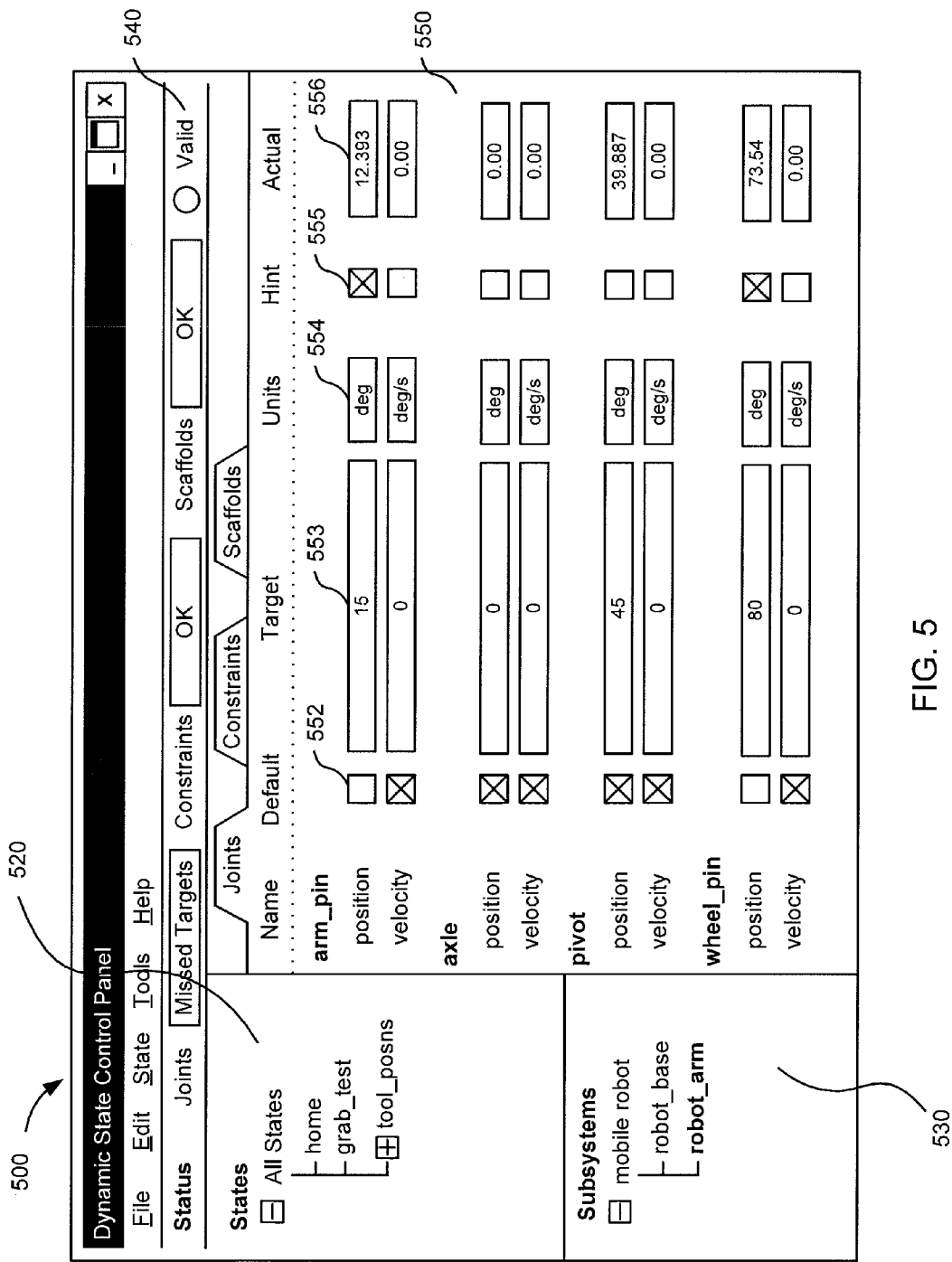
FIG. 5 illustrates an example interface that may be used to specify one or more targets for one or more joints associated with a system.

Interface 500 may be a GUI, a command line interface, or some other type of interface that may be used to specify information, such as, for example, target values, constraints, scaffolds, definitions of operations, or other information. The information may be used by TCE 200. FIG. 5 illustrates an example embodiment of interface 500.

Referring to FIG. 5, interface 500 may include a state navigator 520. The state navigator may list one or more sets of target values as a hierarchy. A set of target values may be used as targets for one or more values (e.g., starting values) of states associated with one or more elements in a network, such as network 260.

For example, a user may use the state navigator to navigate to a set of target values named "home". In response to navigating to "home", TCE 200 may populate the target values in tab 550 based on values contained in the set of target values.

A system, represented by a network, may be partitioned into one or more sub-systems. A sub-system may include one or more elements contained in the network. Interface 500 may also include a system navigator 530 that may be used to navigate through the system and its subsystems, represented by network 260, and display and/or allow editing of values of state associated with elements in the network 260 that represent the system and/or its sub-systems.

For example, network navigator 530 lists the system as "mobile robot". The system may include two sub-systems, one named "robot_base" and the other named "robot_arm". Selecting "robot_arm" may enable values of state associated with one or more elements associated with sub-system "robot_arm" to be displayed and/or edited. As illustrated in FIG. 5, the sub-system "robot_arm" may include the arm pin element (named "arm_pin"), axle element, pivot element, and wheel pint element (named "wheel_pin") of network 260. Selecting "robot_arm" may enable values of state associated with these elements to be specified using the interface 500, as described above.

Interface 500 may also include a status bar 540. The status bar may provide status associated with various values that may be specified using interface 500. For example, status bar 540 may provide a status of values specified in tab 550. The status is shown as "missed targets" which indicates that values specified in tab 550 include target values for state that may not be achievable (are infeasible). The target values for the state may not be achievable due to, for example, physical limitations of the system and/or incompatibility among target values.

Interface 500 may include panel 550. Panel 550 may list one or more elements, that may be associated with network 260, and values of states associated with the elements. For example, the arm pin element may be associated with a position state and a velocity state. These states may be low-level states. Panel 550 may provide (e.g., display) the values of these states. For example, text box 556 may provide a value of the position state.

Check box 552 may be provided by the interface 500 to enable, for example, a user to specify that the value of the position state is to be set to a default value. The default value may be a predetermined value. Text box 553 may be provided by the interface 500 to enable, for example, the user to specify a target value for the position state. Text box 554 may be provided by the interface 500 to enable, for example, the user to specify units (e.g., degrees) associated with the target value. Check box 555 may be provided by the interface 500 to enable, for example, the user to specify that the target value, specified in box 553, is a hint. If hint box 555 is checked, the TCE 200 may treat the target value, specified in box 553, as a suggested target for the state. If the hint box is unchecked, the TCE 200 may treat the target value as a desired target for the state. More information about suggested targets and desired targets will be discussed further below. Box 556 indicates an actual value that has been identified for the state. This value may be identified by TCE 200. Note that the actual value may be different than the target value.

For example, suppose that default box 552 is unchecked, the value "15" is specified in target box 553, and hint box 555 is checked. Since the hint box 555 is checked, TCE 200 may treat the target value in box 553 as a suggested target for the position state. Box 556 provides the actual value of the position state that was identified by TCE 200. The actual value of the position state may be identified based on values of other states in the system as well as the specified target value for the position state. Note that the actual value (i.e., "12.393") is different than the specified target value (i.e., "15").

Also note that a target value for a state may be considered as being "satisfied" even though the value identified for the state does not equal the target value. For example, the TCE 200 may determine whether an identified value for a state associated with an element in a network falls within a predetermined range of values that may be considered satisfactory for a state given the specified target value. If the TCE 200 determines that the actual value falls within the predetermined range of values, the TCE 200 may treat the target value for the position state as satisfied. Note that other criteria may be used to determine whether a target is satisfied.

Figure 6:
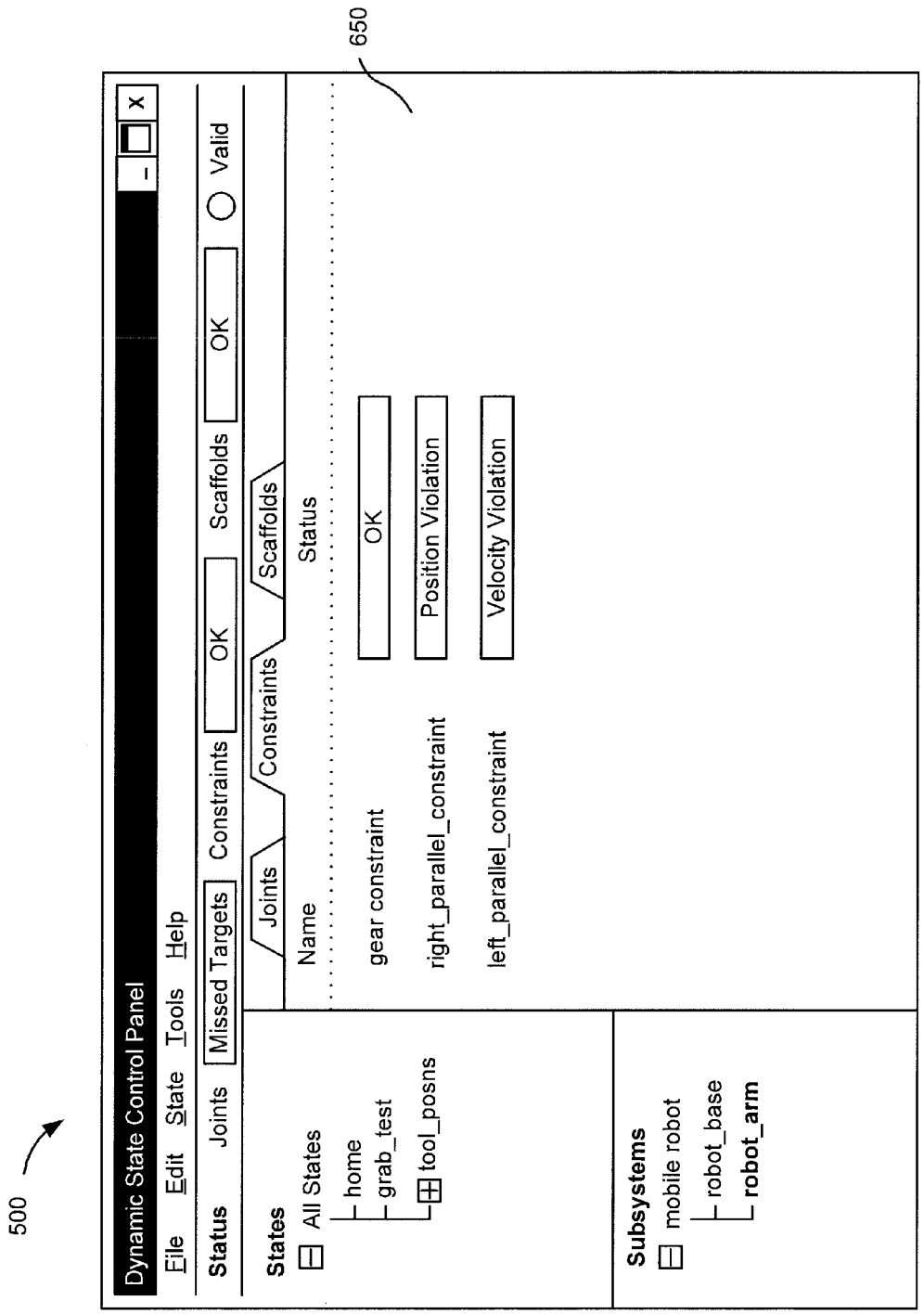
FIG. 6 illustrates an example interface that may be used to indicate a status of one or more constraints associated with a system.

FIG. 6 illustrates an example embodiment of interface 500 that may include a panel 650. Panel 650 may provide a status of one or more constraints that may be associated with a system represented by network 260. The status may be identified based on the value of state associated with one or more elements contained in network 260.

Referring to FIG. 6, the system may contain a constraint named "gear constraint", a constraint named "right_parallel_constraint", and a constraint named "left_parallel_constraint". The status of the "gear constraint" is indicated in the panel 650 as "OK". This status may mean that given the values of one or more states associated with one or more elements contained in network 260, this constraint is determined to be satisfied. Note that the determination may be made by TCE 210.

The status of the "right_parallel_constraint" indicated in the panel indicates "position violation". This status may mean that given a design of network 260, a position violation was detected, for example by TCE 200, and this constraint cannot be achieved due to the position violation. The status of the "left_parallel_constraint" indicated in the panel indicates "velocity violation". This status may mean that given the design of the network 260, a velocity violation was detected, for example by TCE 200, and this constraint cannot be achieved.

Position violations may occur because of limitations (e.g., mechanical limitations, electrical limitations) in a system's design. For example, if the system is a motorcycle, it may not be possible for the system to have front and rear axles that are two meters apart and front and rear wheel centers that are three meters apart.

"Velocity" may be used in the sense of a 3-D spatial velocity and the "velocity" of an entity in a system may be its linear and angular velocity in a 3-D space. Velocity violations may occur because of limitations (e.g., mechanical limitations) in the system. For example, suppose a system has two identical gears that are meshed. A velocity violation may occur if a set of target values and/or scaffolds for the system indicate that one of the gears turns at a rate of twenty revolutions-per-minute (rpm) while the other turns at a rate of forty rpm. Since the gears are identical and are meshed, they both must turn at the same rate. Thus, specifying that a gear that turns at twenty rpm is meshed with another identical gear that turns at forty rpm is infeasible and may lead to a velocity violation.

A state of a system that aligns all of the part of the system and keeps them aligned as simulation of the system commences is said to be a valid assembly. A valid assembly does not have any position or velocity violations. Targets and/or scaffolds that may be specified for the system may be of secondary importance to achieving a valid assembly of the system.

A scaffold may be used to specify a condition in a domain of a model that in a manner that may be intuitive or natural to, for example, a user. A scaffold may involve an appropriate setting of a number of low-level states in a network, such as network 260. A scaffold may be specified in a domain-specific language or in some other high-level language. The language may be, for example, a textual language.

Figure 7:
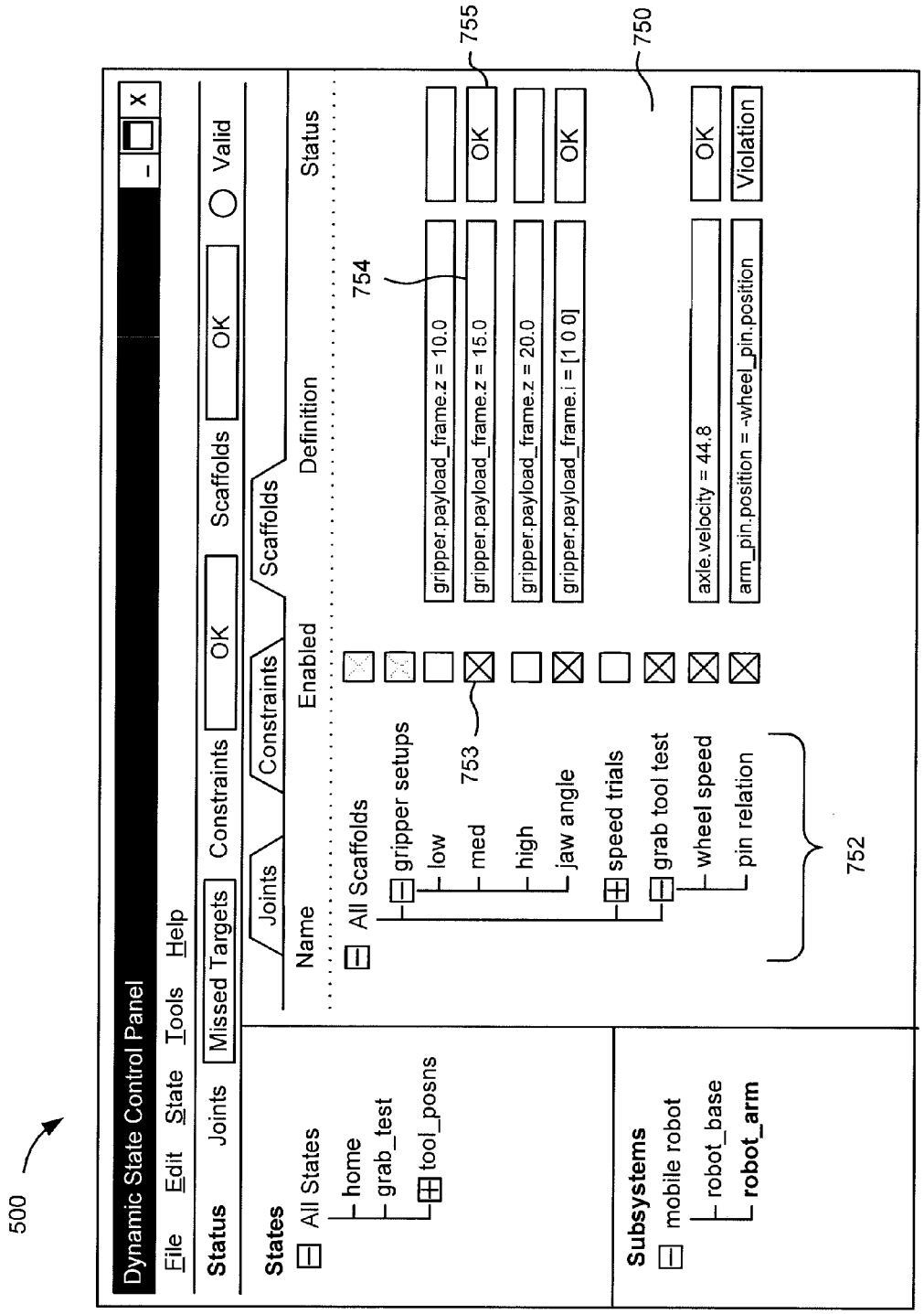
FIG. 7 illustrates an example interface that may be used to specify one or more scaffolds associated with a system.

FIG. 7 illustrates an example embodiment of interface 500 that may include a panel 750 that may enable, for example, a user to specify one or more scaffolds for one or more states associated with one or more elements of network 260. Referring to FIG. 7, the panel 750 may include a scaffold navigator 752, a check box 753 that may be used to enable a particular scaffold, a text box 754 that may be used to specify a scaffold, and a text box 755 that may be used as a status indicator to indicate a status of an enabled scaffold. Note the status indicator may indicate whether the scaffold is feasible. For example, an indication of "OK" may indicate that the scaffold is feasible. Likewise, for example, an indication of "Violation" may indicate that the scaffold is infeasible. Note that these indications/indicators are examples and that other status indications/indicators may be used.

A scaffold may be used to specify a desired state of a network or a portion of a network. The scaffold may be specified as a high-level definition of the desired state. Values for one or more low-level states associated with the network, or portion thereof, may be identified based on the scaffold. The values of the one or more low-level states may be established (e.g., set) based on the identified values.

As noted above, a scaffold may be specified as a high-level definition. For example, as noted above, the arm pin element in network 260 may be associated with a position state. A desired value of the position state may be specified as a scaffold using the following high-level definition: "arm_pin.position=−wheel_pin.position". The scaffold may be processed and a value may be identified based on the high-level definition. An actual value of the position state may be established based on the identified value. Alternatively, the scaffold may be processed to identify an actual value for the position state directly. If an identified value is infeasible, an error may be reported. The error may be reported, for example, in an error message, in a return code, as an exception condition, or in some other manner. In addition, a default value may be used for the actual value instead of the identified value.

Another example of a scaffold for network 260 may be specified by the following high-level definition: "make gripper horizontal to axle base". Here, the high-level definition "make gripper horizontal to axle base" may be processed to produce actual values for one or more states that may be associated with the network 260 to meet or at least closely approximate the desired state specified by the scaffold. Note that if the desired state specified by the scaffold is infeasible (e.g., the scaffold or a close approximation of the scaffold cannot be achieved), an error may be reported.

A target may differ from a scaffold in that a target may express a preference that a particular state (e.g., a position or velocity of a single joint) is a particular specified value, whereas, a scaffold may not, in general, refer to any particular state. Rather, a scaffold may refer to some higher-level property of a mechanism (e.g., a direction of a frame axis) that may be determined by an entire set of states. The set may include states associated with, for example, multiple joints. For example, the scaffold in text box 754 may specify a z-coordinate, which may be associated with a frame that is associated with a payload held by the gripper element in network 260. The value of the z-coordinate may depend on states associated with many joints in network 260. The scaffold may be used to generate values of the states to satisfy the condition specified in the scaffold, which in this example is the z-coordinate equaling or closely approximating the value "15".

Referring back to FIG. 7, the scaffold navigator 752 may be used to navigate through several scaffolds. The scaffolds may be arranged in a hierarchy. For example, a group named "gripper setups" includes scaffolds named "low", "med", "high", and "jaw angle". These scaffolds may be used to define one or more desired values for state associated with the gripper element in network 260 using a high-level definition. Note that the "low", "med", "high", and "jaw angle" scaffolds are hierarchically arranged under the "gripper setups" group and may be accessed by expanding the group using expansion widget 756*a*.

Likewise, for example, a group named "grab tool test" includes scaffolds named "wheel speed" and "pin relation". These scaffolds may be used to define one or more desired values for state associated with the axle and arm pin elements, respectively, in network 260 using a high-level definition. Note that the "wheel speed" and "pin relation" are hierarchically arranged under the "gripper setups" group and may be accessed by expanding the group using expansion widget 756*b*.

In panel 750, a check box may be used to specify whether a particular scaffold is enabled. If a scaffold is enabled, it may be used to generate values for one or more states associated with a network. If a scaffold is disabled, it may be ignored (e.g., not used to identify any values for any states associated with the network). For example, check box 753 may be checked to indicate that the scaffold named "med" is enabled. Thus, the scaffold may be used to identify values of one or more states associated with the network. Likewise, for example, the check box for the scaffold named "low" is not checked. Thus, the scaffold named "low" is disabled and may, for example, not be used to identify any values for any states associated with the network.

In panel 750, a high-level definition of a scaffold may be specified using a definition text box. The high-level definition may be processed by TCE 200 to generate values for one or more states associated with the network.

For example, text box 754 may be used to specify a high-level definition for the scaffold named "med". The high-level definition is specified in this example as "gripper.payload_frame.z=15.0". This high-level definition may indicate that a desired value for a z-coordinate, which may be associated with a frame that may be associated with a payload held by the gripper element in network 260, is "15.0" or an approximation thereof. The high-level definition may be processed by TCE 200 to generate values for one or more states associated with one or more elements in network 260 to satisfy this condition.

In panel 750, a status indicator may be provided to indicate a status of a scaffold. The status may reflect whether the scaffold is feasible. For example, the scaffold named "med" contains a high-level definition that may be used to generate a feasible value for the z-coordinate named "gripper.payload_frame.z". Thus, the scaffold's status is indicated in panel 750 as "OK". On the other hand, the scaffold named "pin relation" contains a high-level definition that may not be used to generate a feasible value for a state named "arm_pin.position". Here, the scaffold, as defined, may be considered infeasible since the desired state specified by the scaffold cannot be satisfied. This may be due to a violation (e.g., position violation) associated with the high-level definition. Thus, the status for this scaffold is indicated in the panel 750 as "Violation".

Figure 8A:
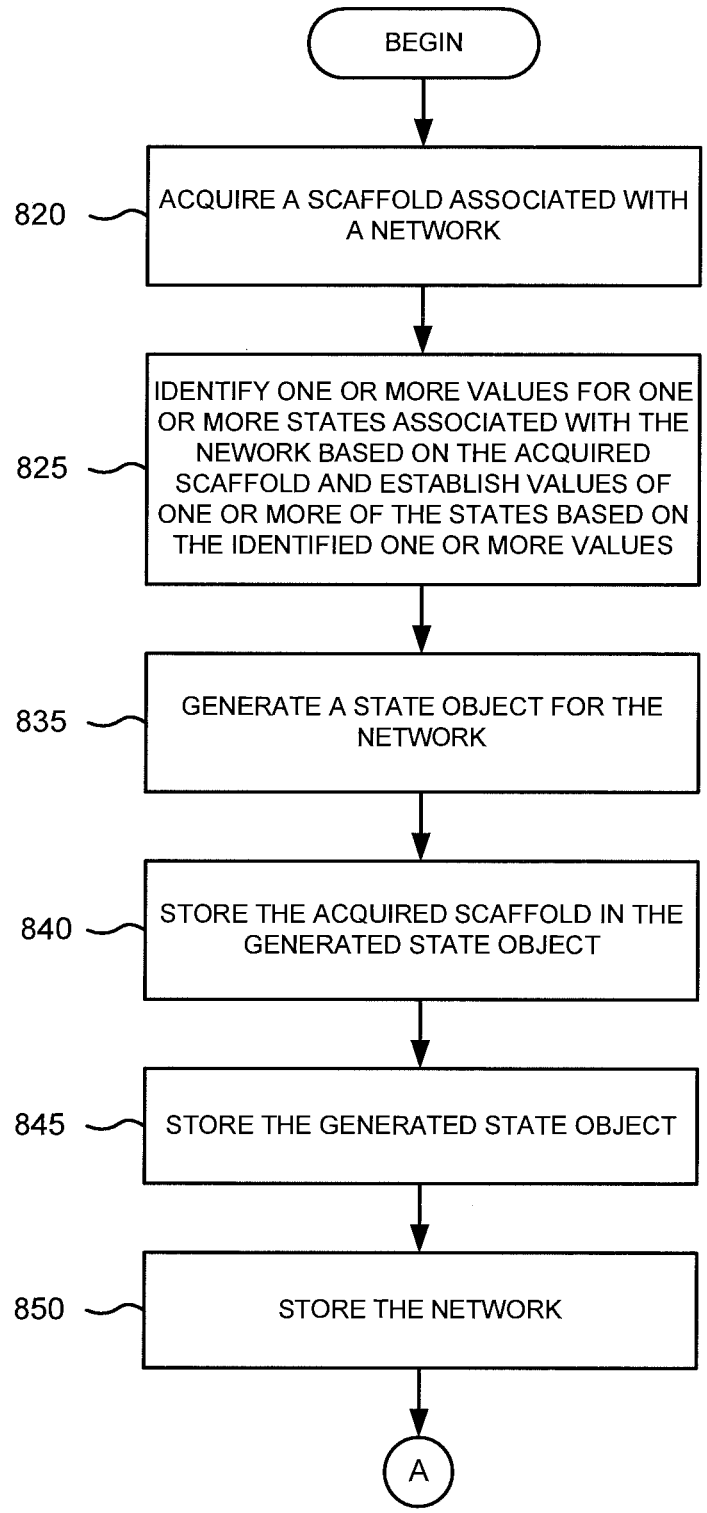
FIGS. 8A-B illustrate a flow chart of example acts that may be used to establish values of one or more states associated with a network based on a scaffold.
Figure 8B:
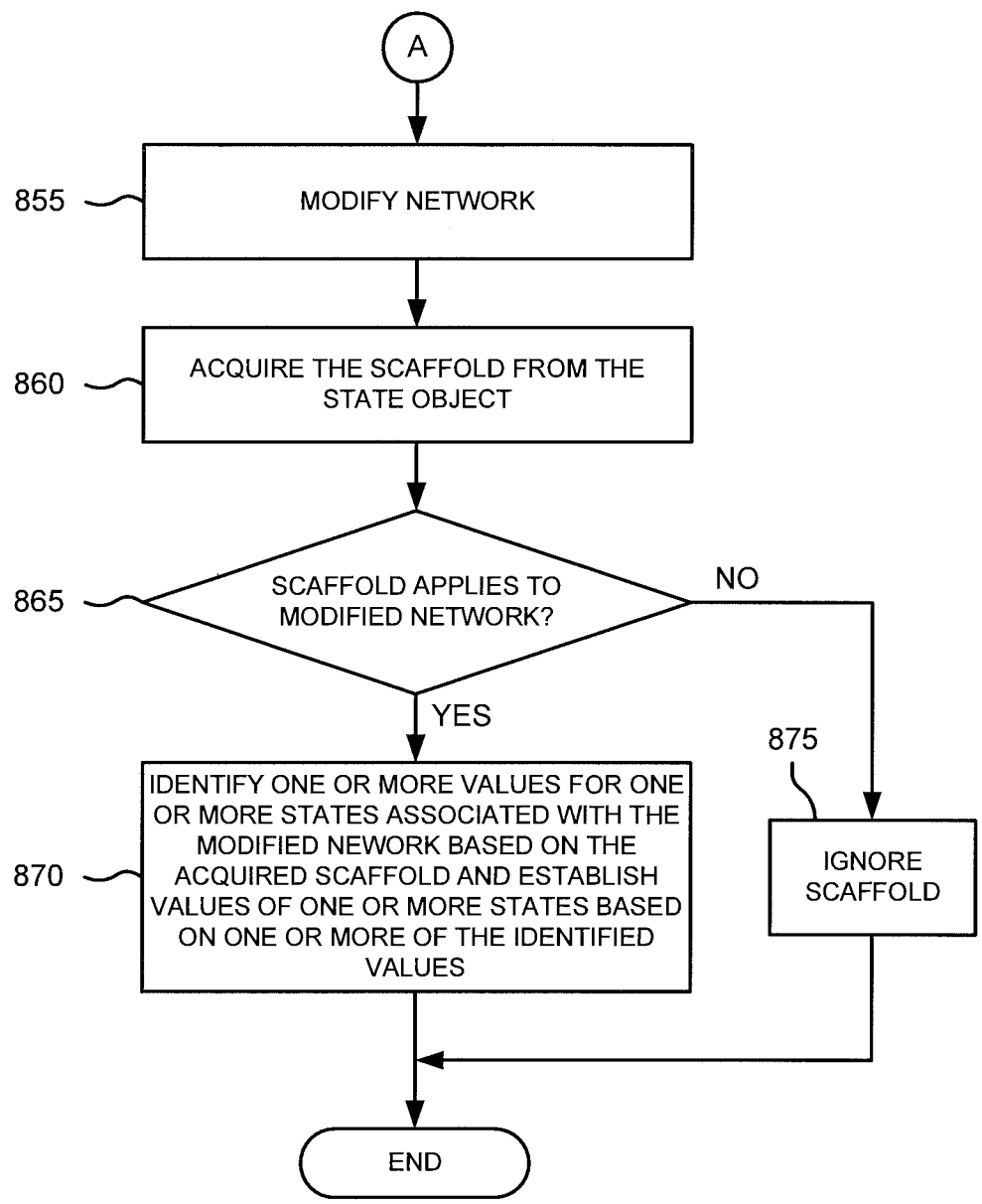

FIGS. 8A-B illustrate a flow chart of example acts that may be used to establish values of one or more states associated with a network based on, for example, a scaffold. The example acts may be performed, for example, by a TCE, such as TCE 200.

Referring to FIGS. 8A-B, at block 820, a scaffold associated with the network is acquired. The network may represent a physical system. The network may have one or more elements that represent one or more entities of the physical system. The scaffold may be used to identify a plurality of values for a plurality of states associated with the network. The scaffold may be acquired via an interface, such as interface 500. The scaffold may be specified as a high-level definition. The high-level definition may be specified using a language, such as described above.

Note that the scaffold may be acquired using other techniques. For example, the scaffold may be contained in a computer file that may reside in storage, such as primary storage 130 or secondary storage 150. Here, the scaffold may be acquired by reading the scaffold from the computer file.

The scaffold may be stored separately from the network. For example, the scaffold may be stored in a first computer file and the network may be stored in a second computer file. The first computer file and the second computer file may be different computer files. Moreover, the first computer file and the second computer file may reside (e.g., stored) in the same storage or in different storage. For example, the first computer file and the second computer file may be stored on the same storage device (e.g., magnetic disk, optical disk, RAM disk, flash drive). Alternatively, for example, the first computer file may be stored in a first storage device and the second computer file may be stored in a second storage device, where the second storage device is different than the first storage device.

The scaffold and network may be stored separately in a database. For example, the scaffold may be stored in a first table in the database and the network may be stored in a second table in the database, where the first table and second tables are different tables.

The scaffold may be stored in a state object that is associated with the network. A state object may contain information associated with a state of a network. The information may be used to establish a state of the network. The information may include, for example, scaffolds, target values, and/or values of low-level states associated with the network. The state object may be stored separately from the network (e.g., in a separate file, separate table in a database).

At block 825, one or more values for one or more states associated with the network are identified (e.g., generated) based on the acquired scaffold and the values of the one or more states may be established based on the identified one or more values. The states may be low-level states associated with one or more elements in the network. Identifying the values may include processing the scaffold. Processing may include, for example, parsing, compiling, and/or interpreting the scaffold. The values may be identified based on a result of the processing.

For example, the high-level definition may be evaluated and a value may be generated based on a result of the evaluation. A value of a state may be established based on an identified value by, for example, setting the value of the state to the identified value. Moreover, the value of the state may be established by, for example, applying a factor to the identified value to produce a resultant value and setting the value of the state to the resultant value. Note that other ways of identifying a value and establishing the value of the state based on the identified value may be used.

At block 835, a state object, for the network, is generated. The state object may be used to hold information for establishing a state of the network. Generating the state object may include, for example, allocating/creating resources to hold the information. For example, the state object may be contained in primary storage 130. Generating the state object may include allocating storage space in primary storage 130 for the state object.

At block 840, the acquired scaffold is stored in the generated state object. For example, the state object may be a database that contains a table for storing scaffolds associated with the network. The acquired scaffold may be stored as an entry (e.g., a record) in the table. Other tables in the database may be used to store other information associated with the state object. For example, target values and/or values of low-level states associated with the network may be part of the state object. Separate tables may be maintained in the database to hold this information.

At block 845, the generated state object is stored. The state object may be stored in storage. The storage may be, for example, a primary storage, such as, primary storage 130, or a secondary storage, such as secondary storage 150. The state object may be stored in the storage as, for example, a storage entity, such as a file, database, or some other storage entity.

At block 850, the network is stored. The network may be stored in storage. The storage may be, for example, a primary storage, such as, primary storage 130, or a secondary storage, such as secondary storage 150. The network may be stored in the storage as a storage entity, which may be, for example, a file, database, or some other storage entity. The network may be stored separate from the state object. For example, the state object may be stored in a first storage entity and the network may be stored in a second storage entity that is different than the first storage entity.

At block 855 (FIG. 8B), the network is modified. The network may be modified, for example, using an editor, such as editor 240. The modification may entail, for example, changing an element and/or state in the network. Note that other modifications may be made to the network.

At block 860, the scaffold is acquired from the state object. The scaffold may be acquired, for example, by reading the scaffold from the state object.

At block 865, a check is performed to determine whether the scaffold, acquired from the state object, applies to the modified network. For example, suppose that the network is network 260 as illustrated in FIG. 4. Further suppose that a user modified the network 260 to remove the gripper element. Now suppose that the scaffold in the state object specifies a position for the gripper element. Since the modified network 260 does not contain the gripper element, the scaffold may be considered as being non-applicable to the modified network 260 and thus may be considered to not apply to the modified network 260.

If at block 865, the scaffold is determined to not apply to the modified network, at block 875, the scaffold is ignored. The scaffold may be ignored, for example, by not identifying any values for any state for the network based on the scaffold.

If at block 865, the scaffold is determined to apply to the modified network, at block 870, one or more values for one or more states associated with the modified network (e.g., one or more values of one or more states contained in one or more elements in the network) are identified based on the acquired scaffold. In addition, one or more values of one or more states in the network may be established based on one or more of the identified values. The values may be established as described above.

The above acts may be applied as follows. Suppose, for example, that a user desires to establish a state for the network 260 illustrated in FIG. 4. The state may be a beginning state for a simulation of the system represented by the network 260. The user may specify the beginning state as a scaffold for the network 260. The scaffold may be specified as a high-level definition of the beginning state. The high-level definition may be entered, for example, via the interface 500 illustrated in FIG. 7. The high-level definition may be entered in the form of a language that may be processed by TCE 200.

Now suppose the desired state for network 260 may be to have the gripper positioned horizontal to the axle base. The user may enter "make gripper horizontal to axle base" as a scaffold for the network 260 in pane 750. TCE 200 may acquire the scaffold by reading it from the pane 750 (block 820).

TCE 200 may process the high-level definition. Processing may include determining whether the desired state specified by the high-level definition is feasible (e.g., the desired state can be achieved given various constraints, design, and or/other factors associated with the system). If it is determined that the high-level definition is infeasible, the TCE 200 may indicate this situation on an output device 170. For example, the TCE 200 may provide a status indication/indicator in the interface 500 to indicate that the high-level definition is infeasible. If it is determined that the high-level definition is feasible, the TCE 200 may identify values for one or more low-level states associated with one or more elements in network 260 (block 830). The TCE 200 may also establish values of one or more of the low-level states based on the identified values, such as described above (block 830).

The TCE 200 may generate a state object for the network (block 835). Generating the state object may include, for example, allocating space in storage, such as primary storage 130 and/or secondary storage 150. The TCE 200 may store the acquired scaffold in the generated state object (block 840). The TCE 200 may store the generated state object (block 845). For example, the state object may be generated in primary storage 130 and the TCE 200 may store the generated state object in the secondary storage 150. The state object may be stored as a file, record, table, database, and/or some other structure in storage 150.

The TCE 200 may store the network 260 (block 850). The network 260 may be stored in as a file, record, table, database, and/or some other structure. The network 260 may be stored separate from the state object, as described above.

Now suppose the user directs editor 240 to modify the network 260 (block 855). The TCE 200 may acquire the scaffold from the state object (block 860). The scaffold may be acquired, for example, by reading it from the state object. The TCE 200 may check the scaffold to determine whether it applies to the modified network 260 (block 865).

Suppose the scaffold still applies to the modified network 260. The TCE 200 may (1) identify one or more values for one or more states associated with the modified network 260 based on the acquired scaffold and (2) establish values of one or more states in the modified network 260 based on one or more of the identified values (block 870).

Figure 9A:
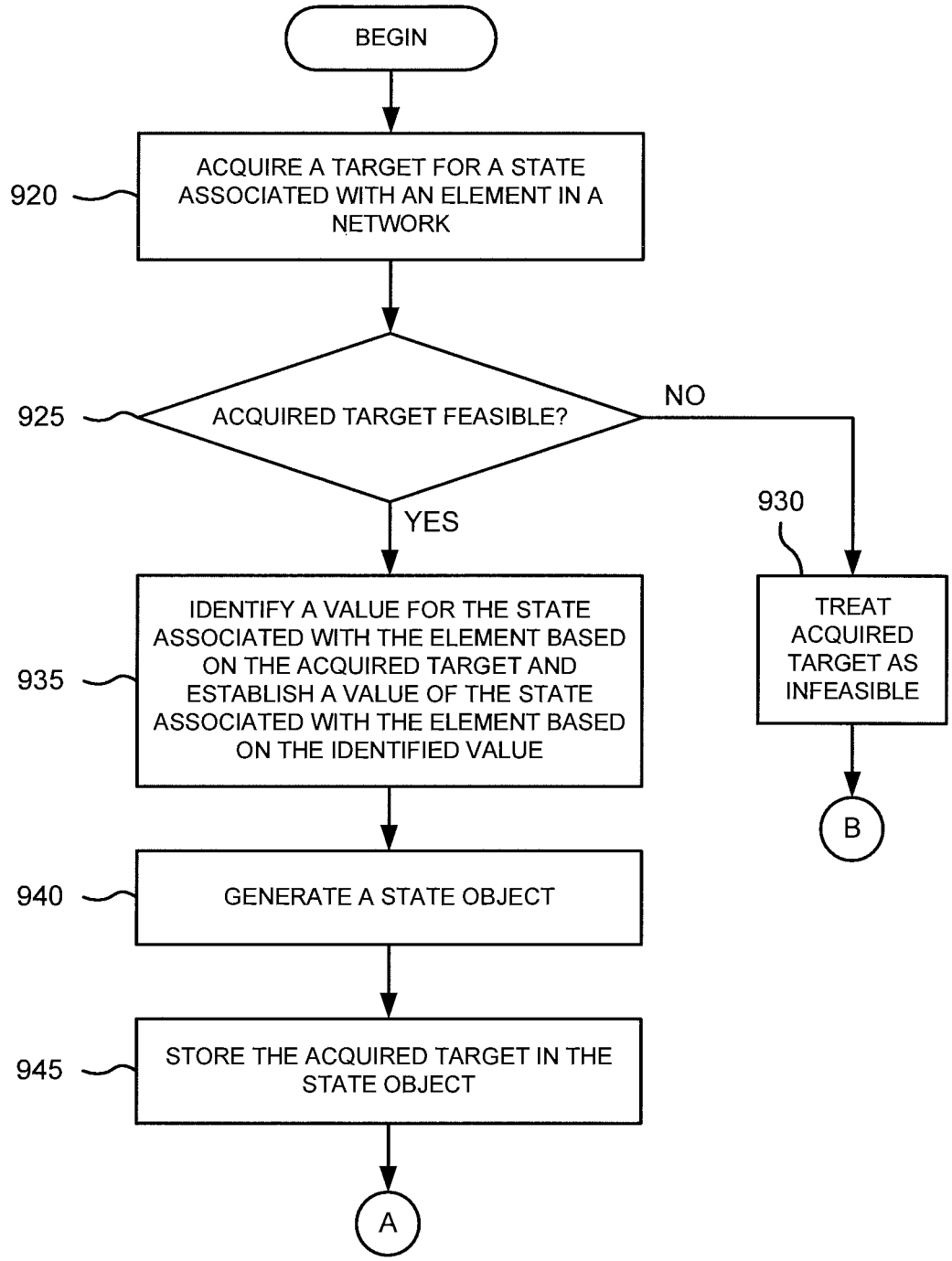
FIGS. 9A-B illustrate a flow chart of example acts that may be used to establish values of one or more states associated with a network based on a target.
Figure 9B:
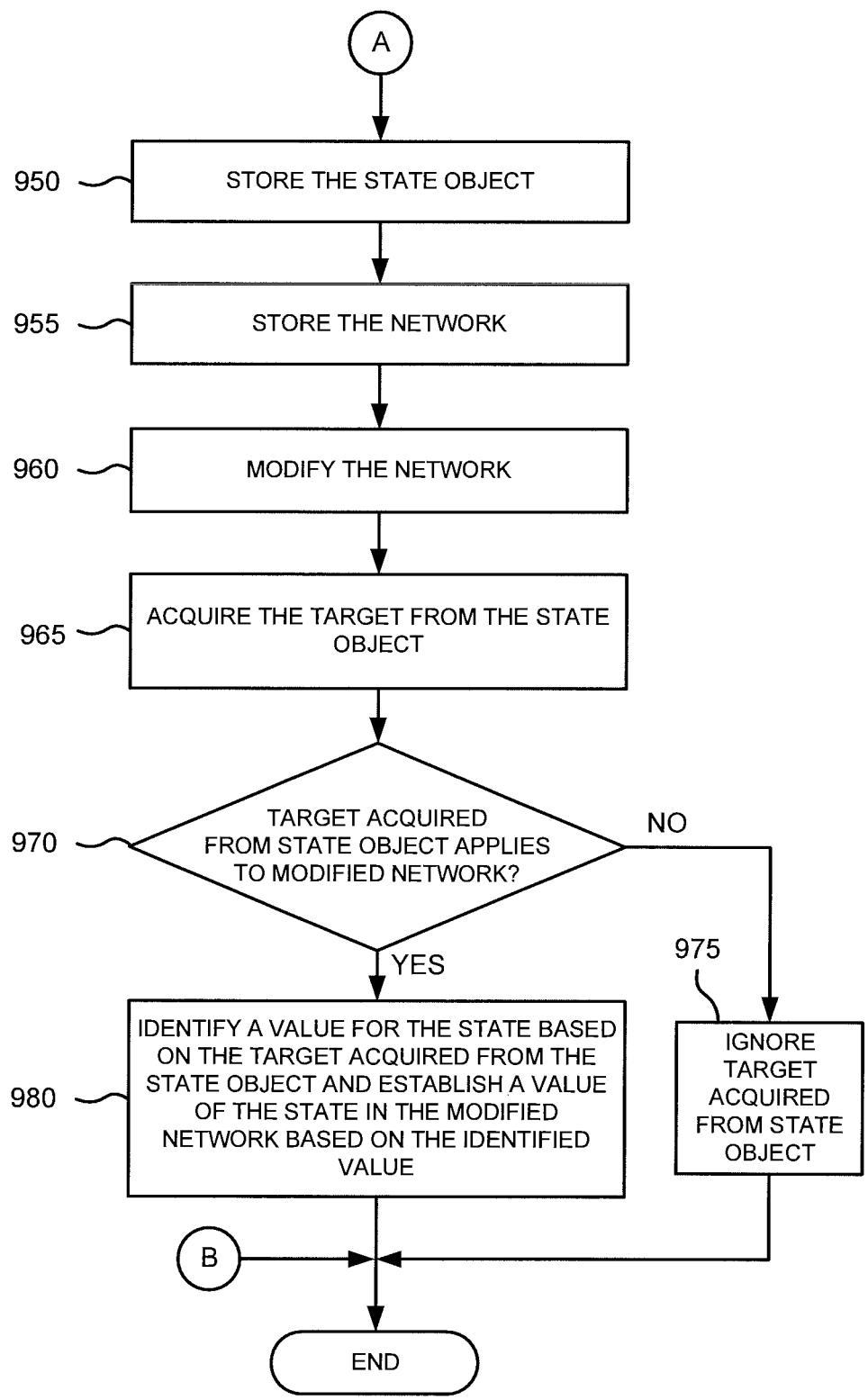

FIGS. 9A-B illustrate a flow chart of example acts that may be used to establish a value of a state, associated with an element in a network, based on, for example, a target. The target may be, for example, a target value.

Referring to FIGS. 9A-B, at block 920, the target for the state is acquired. The target may be acquired (1) via an interface, such as interface 500, (2) from a file contained in a storage, such as primary storage 130 and/or secondary storage 150, or (3) using some other technique. The target may be a desired target or suggested target for the state.

At block 925, a check is performed to determine whether the acquired target is feasible. For example, the acquired target may be a suggested target. Moreover, the acquired target may be a target value for the state. A check may be performed to determine whether the target value or an approximation of the target value (e.g., a value within a certain range of the acquired target value) can be used for the state's value given various factors that may be associated with the system represented by the network (e.g., constraints within the system, system design, other factors). If the target value or an approximation of the target value can be used, then the acquired target may be determined to be feasible. Otherwise, the acquired target may be determined to be infeasible.

Likewise, for example, the acquired target may be a desired target for the state. Further, as above, the acquired target may be a target value for the state. A check may be performed to determine whether the target value can be used as a value for the state. If not, the acquired target may be determined to be infeasible. Otherwise, if the target value can be used as the value for the state, the acquired target may be determined to be feasible.

If the at block 925, the acquired target is determined to be infeasible, at block 930, the acquired target is treated as infeasible. Treating the acquired target as infeasible may include, for example, reporting an error condition, ignoring the target (e.g., not using the target to identify a value for the state), or other actions associated with treating the acquired target as infeasible.

If at block 925, the acquired target is determined to be feasible, at block 935, a value for the state is identified based on the acquired target. Also at block 935, a value of the state is established based on the identified value. For example, suppose the state is a low-level state and the acquired target is a desired target for the state. Further suppose that the acquired target is a target value for the state. A value for the state may be identified based on the target value. The value may be, for example, the target value or a close approximation to the target value. A value that is a close approximation to the target may include, for example, a value that falls within a certain range of values. The range of values may be, for example, (1) centered on the target value, (2) within a certain percentage of the target, (3) biased in a certain direction from the target, or (4) otherwise defined. Note that, in addition to the target value, the value may be identified based on other factors as well, such as constraints, design of a system represented by the network, and/or other factors. Also note, that the acquired target may be considered satisfied if a value can be identified.

A value of the low-level state may be established based on the identified value. The value of the low-level state may be established, for example, by setting the value of the low-level state to the identified value, applying a factor to the identified value or performing some other operation on the identified value to generate a resultant value and setting the value of the low-level state to the resultant value, or establishing the value of the low-level state, based on the identified value, in some other way.

At block 940, a state object is generated. The state object may be generated as described above. At block 945, the acquired target is stored in the state object. For example, the acquired target may be stored in a record, table, or some other structure in the state object that may hold the acquired target. At block 950 (FIG. 9B), the state object is stored. The state object may be stored as described above.

At block 955, the network is stored. The network may be stored separate from the state object, such as described above. At block 960, the network is modified. The network may be modified, for example, by changing adding/deleting an element, adding/deleting a state, or some other modification. The network may be modified, for example, using an interface, such as described above.

Note that the network may be modified in other ways. For example, the network may be modified by a TCE, such as TCE 200, in response to a change made to a graphical representation of the system represented by the network. For example, suppose that network 260, depicted in FIG. 4, represents the system that is depicted in graphical view 300. Now suppose that a user makes a change to an entity of the system depicted in graphical view 300 (e.g., the user extends graphical object 330). In response to the change, TCE 200 may modify network 260 to reflect the change (e.g., the TCE 200 may change a value of a parameter associated with an element that represents graphical object 330).

At block 965, the target is acquired from the state object. The target may be acquired by, for example, reading the target from the state object. At block 970, a check is performed to determine whether the target, acquired from the state object, applies to the modified network. If not, at block 975, the target is ignored. The target may be ignored, such as described above.

If at block 970, the target applies to the modified network, at block 980, a value of a state, associated with the network (e.g., a state in an element contained in the network), is identified based on the target. In addition, a value of the state may be established based on the identified value, such as described above.

The above acts may be applied, for example, as follows. Suppose, for example, that a user desires to establish a value of a state in the network 260 depicted in FIG. 4 based on a target value that is a suggested target. Further suppose that the state is a position state associated with the wrist element in network 260.

The user may enter the target value via interface 500 (FIG. 5). The TCE 200 may acquire the target value by reading the value from pane 550 (block 920). The TCE 200 may determine whether the acquired target value is feasible, such as described above (block 925). Suppose the TCE 200 determines the acquired target value is feasible.

The TCE 200 may identify a value for the state based on the acquired target value (block 935). Specifically, the TCE 200 may determine whether the target value is feasible and if so, a value for the state associated with the wrist element may be identified (e.g., generated) based on the target value. Note that the identified value may be the target value or a close approximation of the target value.

The TCE 200 may establish the value of the state associated with the wrist element based on the identified value (block 935). The value may be established by, for example, setting the value of the state to the value identified for the state, applying an operation to the identified value to generate a resultant value and setting the value of the state to the resultant value, or the value of the state may be established, based on the identified value, in some other way.

The TCE 200 may generate a state object associated with the network 260 (block 940). The state object may be generated as described above. The TCE 200 may store the acquired target value in the state object (block 945). For example, the state object may be a table in a database and the acquired target value may be stored in an entry in the table. The database may be stored in, for example, primary storage 130 and/or secondary storage 150. Likewise, for example, the state object may be contained a file and the target value may be stored in a record contained in the file.

The TCE 200 may store the state object in primary storage 130 and/or secondary storage 150 (block 950). Likewise, TCE 200 may store the network 260 in primary storage 130 and/or secondary storage 150 (block 955). The network may be stored separate from the state object. For example, the network may be stored in a file and the state object may be stored in a database that is not related to the file. Likewise, for example, the network may be stored in a table in a database and the state object may be stored in a different table in the same database. The file and database may be contained in primary storage 130 and/or secondary storage 150.

Now suppose that a user directs the editor 240 to modify the network, such as described above (block 960). The TCE 200 may acquire the target value from the stored state object by, for example, reading the target value from the stored date object (block 965), such as described above. The TCE 200 may determine whether the target value, acquired from the stored state object, applies to the modified network (block 970). For example, if the TCE 200 determines that the target value is no longer feasible given the modified network, the TCE 200 may determine that the acquired target value does not apply to the modified network.

Suppose that the TCE 200 determines that the target value applies to the modified network. The TCE 200 may identify a value for the state, associated with the wrist element, based on the acquired target value (block 980). The identified value may be, for example, the target value or a close approximation of the target value, such as described above. The TCE 200 may establish a value of the state based on the identified value (block 980). The value of the state may be established as described above.

Figure 10:
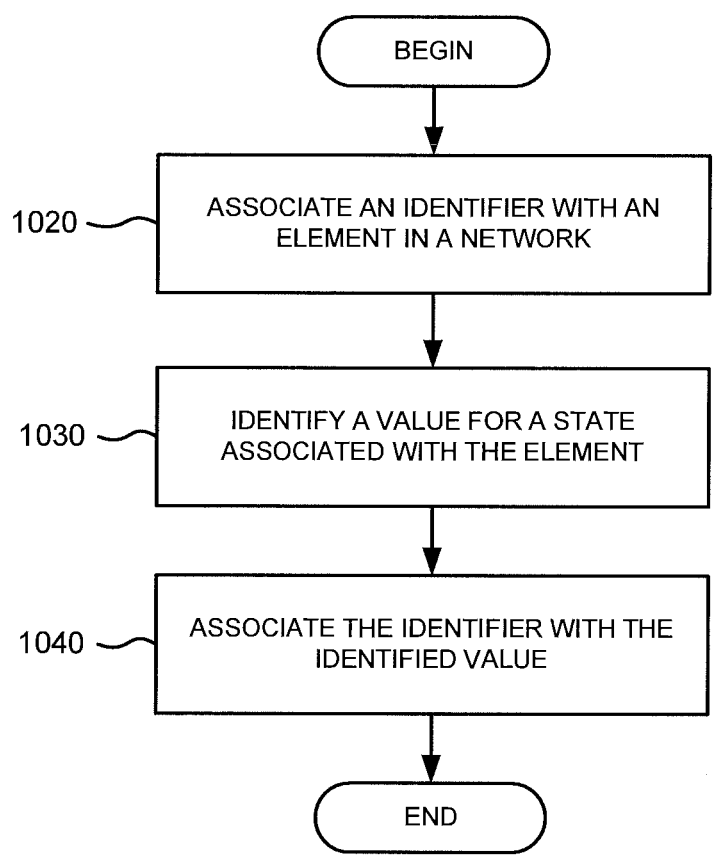
FIG. 10 illustrates a flow chart of example acts that may be used to associate an identifier with an element in a network and with a value generated for state associated with the element.

FIG. 10 illustrates a flow chart of example acts that may be used to associate an identifier with (1) an element in a network and (2) one or more values of one or more states associated with the element. The values may include, for example, values that may have been identified using targets and/or scaffolds, such as described above.

Referring to FIG. 10, at block 1020, an identifier is associated with an element in a network. The identifier may be a globally unique identifier (GUID) in that it may be unique, for example, across a plurality of networks. The identifier may be associated with the network by, for example, storing the identifier in a data record that may be associated with the network. Note that other ways of associating the identifier with the network may be used.

At block 1030, a value for a state associated with an element in a network is identified. The value may be identified based on, for example, (1) a scaffold, (2) a trajectory of state values that may be identified during an execution of the network (discussed further below), or (3) a target for the state, or (4) otherwise identified.

At block 1040, the identifier is associated with the identified value. The identifier may be associated with the value, for example, by storing the identifier in a data record that may also hold the identified value. Note that other ways of associating the identifier with the value may be used.

The above acts may be applied, for example, as follows. Referring to FIGS. 2, 4, and 10, in network 260, TCE 200 may associate an identifier with the wrist element in the embodiment of network 260 illustrated in FIG. 4 (block 1020). The identifier may be globally unique such that the identifier may be used to identify the wrist element in network 260 and distinguish it from other wrist elements that may be present in other networks. Note that if network 260 were to contain a second wrist element, the first identifier may be used to also distinguish the wrist element from the second wrist element. Now suppose that TCE 200 generates a value for a position state that may be associated with the wrist element (block 1030). TCE 200 may associate the identifier generated for the wrist element with the generated value for the position state (block 1040).

Another way the above acts may be applied may be as follows. The TCE 200 may generate an identifier for the position state (associated with the wrist element) that may be used to distinguish the position state from other state in network 260 as well as other state in other networks (block 1020). The TCE 200 may generate a value for the position state (block 1030). The TCE 200 may associate the generated value with the identifier (block 1040). Here, the wrist element may be represented, for example, as an object. The object may contain a data member that is associated with the position state. The data member may itself be an object that contains a first data member for holding the generated value and a second data member for holding the generated identifier. The identifier may be associated with the value generated for the position state by placing the generated value in the first data member and the generated identifier in the second data member.

As noted above, the flowchart illustrated in FIG. 10 illustrates example acts that may be used to associate an identifier with an element in a network and with a value generated for state associated with the element. It should be noted that identifiers may be used in other ways to identify other aspects of a network.

For example, an identifier, such as a GUID, may be associated with a state in a network. The state may be further associated with an element in the network. The identifier may be used to uniquely identify the state from other states associated with the network and/or states associated with one or more other networks. A value may be identified for the state, such as described above. The identifier may be associated with the identified value.

Figure 11A:
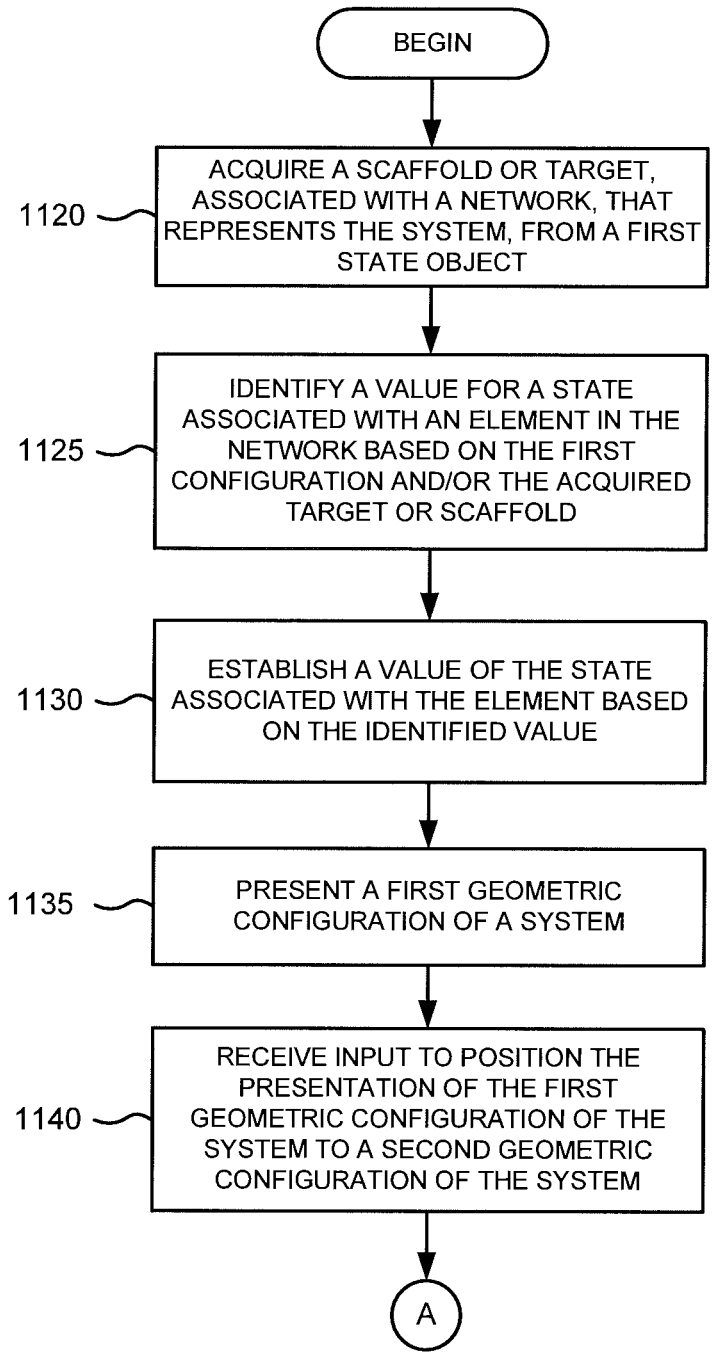
FIGS. 11A-B illustrate a flow chart of example acts that may be used to establish a value of a state associated with an element in a network based on (1) a geometric configuration of a system represented by the network and (2) a target and/or scaffold.
Figure 11B:
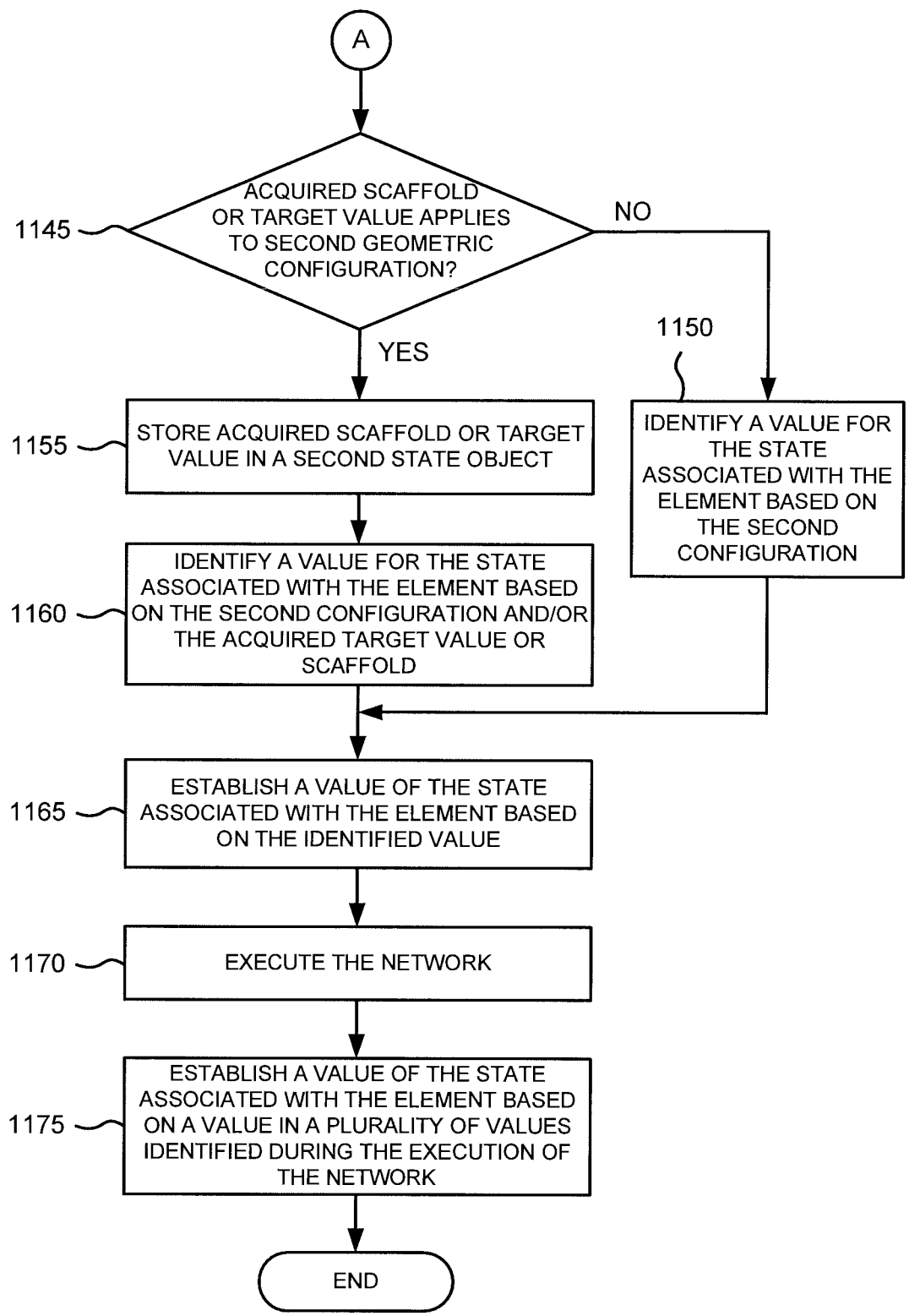

FIGS. 11A-B illustrate a flow chart of example acts that may be used to establish a state associated with an element in a network based on a geometric configuration of a system, represented by the network, and, a target and/or scaffold. The geometric configuration of the system may be a geometric visualization of the network.

Referring to FIGS. 11A-B, at block 1120, a first geometric configuration of the system is presented (e.g., displayed). The geometric configuration may be presented in a graphical view of a network that represents the system. The first geometric configuration of the system may be presented on an output device, such as output device 170.

At block 1125, a scaffold or target, associated with a network that represents the system, is acquired from a first state object. The scaffold or target may be acquired from the first state object, for example, by reading the scaffold or target from the first state object.

At block 1130, a value for a state associated with an element in the network, that represents the system, is identified. The value may be identified based on the first geometric configuration of the system. Here, the first geometric configuration of the system may be analyzed to identify a value of a state associated with an entity (e.g., a position of the entity) represented in the first geometric configuration. The entity may be represented by the element in the network and the state associated with the entity may be represented by the state associated with the element. The value for the state associated with the element may be identified based on the identified value of the state associated with the entity.

Also at block 1130, the value for the state may be identified based on the acquired target or scaffold. For example, the acquired target or scaffold may be used to identify the value for the state, such as described above. Note that other ways for using the acquired target or scaffold to identify the value for the state may be used.

At block 1135, a value of the state associated with the element is established based on the value identified for the state at block 1130. The value of the state associated with the element may be established, for example, by setting the value of the state associated with the element to the value identified for the state at block 1130. Note that other ways of establishing the value of the state may be used.

At block 1140, input to position the presentation of the first geometric configuration of the system to a second geometric configuration of the system is received. The presentation of the first geometric configuration may be "dragged" using an input device, such as input device 160, to the second geometric configuration. The received input may include information related to dragging the first geometric configuration to the second geometric configuration. For example, the received input may include an indication of a position of a cursor (e.g., mouse cursor) associated with the input device that may be used to drag the presentation from the first geometric configuration to the second geometric configuration. Likewise, for example, the input device may include a touch screen and the information may include the position of a pointing device (e.g., stylus, finger) that may be used to drag the presentation from the first geometric configuration to the second geometric configuration.

At block 1145 (FIG. 11B), a check is performed to determine whether the scaffold or target, acquired at block 1125, applies to the second geometric configuration. The scaffold or target may be considered applicable to the second geometric configuration if the scaffold or target is feasible given the second geometric configuration.

If at block 1145, the acquired scaffold or target does not apply to the second geometric configuration, at block 1150, a value for the state associated with the element is identified based on the second geometric configuration. The value may be identified, for example, in a similar manner as described above for identifying a value for the state based on the first geometric configuration.

If at block 1145, the acquired scaffold or target does apply to the second geometric configuration, at block 1155, the acquired scaffold or target is stored in a second state object and, at block 1160, a value for the state associated with the element is identified based on the acquired scaffold or target and/or the second geometric configuration. For example, at block 1160, the value for the state may be identified based on the scaffold or target. Likewise, for example, at block 1160, the value for the state may be identified based on the scaffold or target and the second geometric configuration.

At block 1165, a value of the state associated with the element is established based on the identified value for the state. The value of the state may be established as described above.

At block 1170, the network may be executed to simulate the system. Execution may include, for example, generating code from the network, compiling the code to produce executable code, executing the executable code, and/or interpreting the generated code and/or executable code.

During execution, a plurality of values for one or more states in the network may be identified. The plurality of values may be included in a trajectory of state values that may be identified from the execution of the network. The trajectory of state values may represent a time series of values of states associated with the network. A time element in the time series may include values of one or more states (e.g., low-level states) in the network for a particular time associated with the execution of the network.

For example, the execution of the network may be performed in a series of time steps. The time element may be associated with (e.g., contain) one or more values of one or more states in the network for a particular time step. The time series may be displayed and browsed, for example, using an interface, such as interface 500. A time element in the time series may be selected, for example by a user, to specify values of one or more states in the network. Alternatively or in addition to, a particular value in the time element may be selected and the values of one or more states in the network may be established based on the selected value.

At block 1175, a value of the state of the element in the network may be established (e.g., set) based on a value contained in the plurality of values identified during the execution of the network. For example, as noted above, the plurality of values may include a trajectory of states that may represent a time series of states for the network. The time series may be browsed and a time element in the time series may be selected. The value of the state may be established based on one or more values associated with the selected time element.

The following describes an example of how the above acts may be performed. Referring to FIGS. 1, 2, 3, 4, and 11A-B, suppose TCE 200 acquires a scaffold for network 260, as illustrated in FIG. 4 (block 1120). Further suppose that the scaffold indicates "move the gripper 20 degrees upward from its current position". The scaffold may be acquired, for example, via interface 500, from a state object that may be stored in a file in primary storage 130 or secondary storage 150, over a network via a communication interface 180, or otherwise acquired.

TCE 200 may identify values for states associated with various elements in the network 260 to satisfy the scaffold (block 1125). TCE 200 may establish the values of the states based on the identified values, such as described above (block 1130). TCE 200 may display a first geometric configuration of the network 260 (as illustrated in FIG. 4) in geometric view 300 after establishing the values of the states (block 1135). TCE 200 may display the first geometric configuration on an output device 170.

Now suppose a user "grabs" the gripper object 340 in view 300 using an input device 160 and "drags" the gripper object 340 to a second position using the input device 160 (block 1140). The TCE 200 may perform a check to determine whether the acquired scaffold still applies given the second position of the gripper object 340, as described above (block 1145). Specifically, the TCE 200 may analyze the position of the gripper object 340 in the second configuration and determine whether the acquired scaffold is feasible given the position of the gripper object 340 in the second configuration.

Suppose the TCE 200 determines that the acquired scaffold still applies. The TCE 200 may store the acquired scaffold in a second state object (block 1155). The second state object may be a new object that the TCE 200 allocates. Alternatively, the second state object may be the same state object as the first state object and, since the acquired scaffold already exists in the first state object, the TCE 200 may skip storing the scaffold in the state object. Note that, had the acquired scaffold not apply and the second state object is the same state object as the first state object, the TCE 200 may remove the scaffold from the first state object.

The TCE 200 may identify values for one or more states associated with one or more elements in network 260 based on the second position of the gripper element 340 and/or the acquired scaffold (block 1160). The values may be identified as described above. The TCE 200 may then establish the value of the states based on the identified values, such as described above (block 1165).

The TCE 200 may execute the network (block 1170). During execution, the TCE 200 may generate one or more values for one or more states in network 260. Moreover, TCE 200 may maintain a trajectory of state values for one or more of the generated states. The TCE 200 may establish values of one or more states in the network based on values generated during the execution of the network (block 1175). For example, the trajectory of state values may represent a time series of values of states associated with the network. The TCE 200 may display the time series (e.g., after execution of the network) and allow a user to browse the time series via interface 500. The user may select a time element in the time series via the interface 500. The values of the one or more states may be established based on one or more values in the selected time element.

It should be noted that identifiers may be associated with values identified for the one or more states. The identifiers may be used to distinguish the values and the states from one or more other values of one or more other states in the network and/or other networks. For example, suppose one of the identified values is a value of a position state associated with the gripper element represented in network 260 illustrated in FIG. 4. The identifier may be used to identify the value as being a value of the position state associated with the gripper element. Further, the identifier may distinguish the value from (1) one or more other values of one or more other states that may be associated with gripper element, other elements in network 260, and/or (2) one or more other values of one or more other states that may be associated one or more networks other than network 260.

Figure 12:
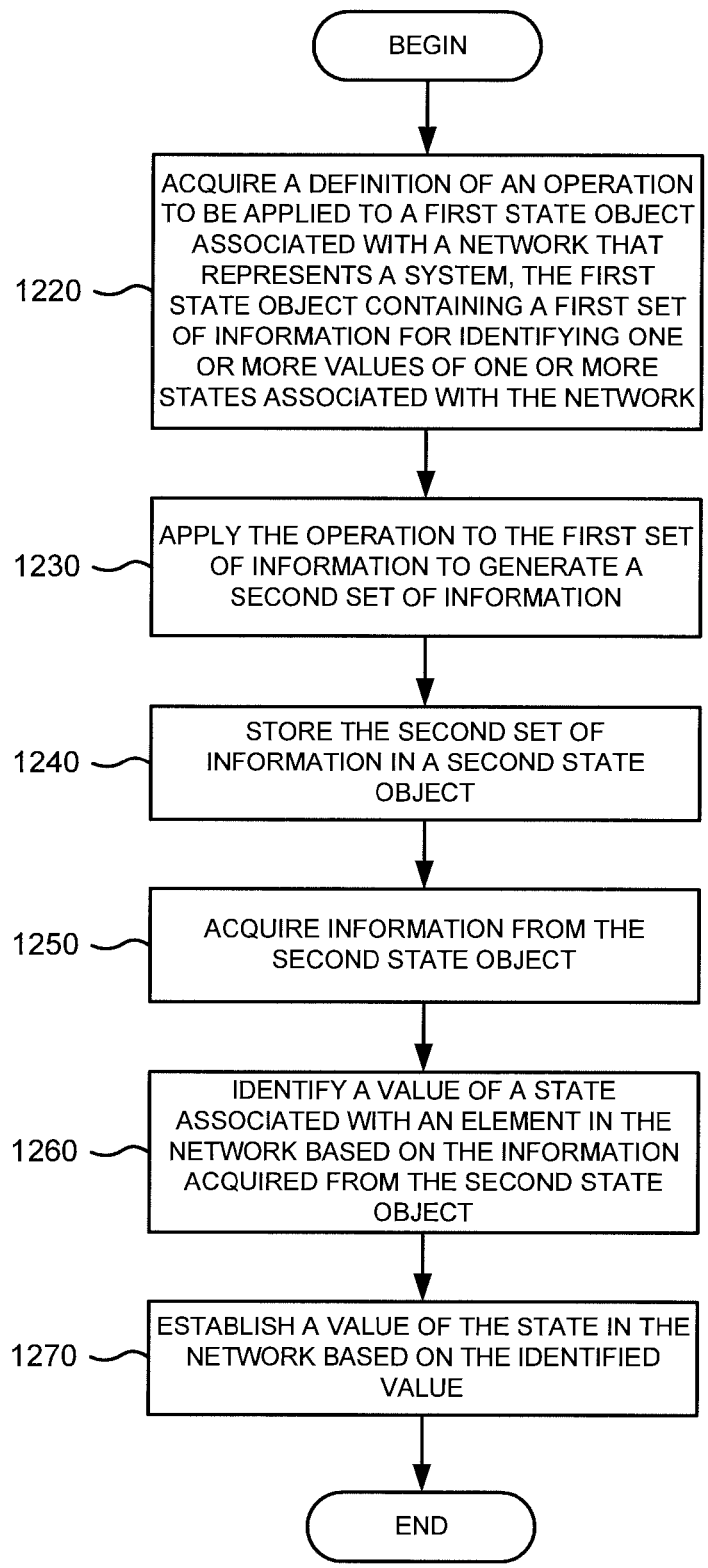
FIG. 12 illustrates a flow chart of example acts that may be used to apply an operation to a first state object, associated with a network, to generate a second state object for the network.

FIG. 12 illustrates a flow chart of example acts that may be used to apply an operation to a state object, associated with the network, to generate a second state object for the network. Referring to FIGS. 12A-B, at block 1220, a definition of an operation to be applied to the state object is acquired. The definition may be acquired via an interface, such as interface 500, reading the definition from a file, receiving the definition in a message, or otherwise acquiring the definition.

The network may represent a system. The state object may contain a first set of information for identifying one or more values of one or more states associated with the network. For example, the first set of information may include a target or scaffold that may be used to identify values for one or more states associated with the network, such as described above.

The definition of the operation may be specified as a high-level definition. The definition of the operation be may be specified using a language. For example, the definition may be specified as a command that is part of a command language. The specified definition may be processed (e.g., parsed, interpreted, compiled) to, for example, identify the operation. Moreover, the definition may be specified using a GUI. For example, the definition may be specified using a widget (e.g., drop-down menu, text box) which may be part of the GUI. Note that other ways of specifying the operation may be used.

The first state object may contain a first set of information for identifying one or more values of one or more states associated with the network. The first set of information may include at least one of a plurality of scaffolds associated with the network, a plurality of target values associated with the network, or at least one scaffold associated with the network and at least one target associated with the network.

At block 1230, the operation is applied to the first set of information to generate a second set of information. The second set of information may be used to identify one or more values of one or more states associated with the network. As noted above, the first set of information may include a plurality of targets and/or a plurality of scaffolds. The second set of information may include a scaffold and/or target that may be included in the first set of information but may not include a different scaffold and/or target that may be included in the first set of information. A result of applying the operation to the first set of information may cause a number of scaffolds and/or targets included in the second set of information to be different than a number of scaffolds and/or target included in the first set of information.

For example, suppose the first set of information includes a target associated with a particular state and a scaffold. The operation may specify that targets associated with the state should be omitted. Thus, applying the operation to the first set of information may yield a second set of information that includes the scaffold from the first set of information but does not include the target. Note that, in this example, the number of scaffolds and targets in the first set of information is different than the number of scaffolds and targets in the second set of information.

At block 1240, the second set of information is stored in a second state object. The second state object may be a new state object that may be, for example, allocated by a TCE, such as TCE 200. Alternatively, the second state object may the same state object as the first state object.

At block 1250, information is acquired from the second state object. The information may be acquired by reading the information from the second state object. The acquired information may include information in the second set of information.

At block 1260, a value of a state in the network is identified based on the information acquired from the second state object. The state may be associated with an element in the network. For example, the information acquired from the second state object may include a target value that is included in the second set of information. Suppose, for example, the state is a position state associated with the gripper element in the network 260 illustrated in FIG. 4 and that the target is a target value for the state. The value of the state may be identified based on the acquired target value, such as described above.

At block 1270, a value of the state in the network is established based on the identified value. The value may be established as described above.

Note that in addition to scaffolds and/or targets, the first set of information may include values for one or more states (e.g., low-level states) in the network may be used as sources for the operation applied at block 1240. Also note that the values may be independent of the operation. Moreover, the values may include, for example, some combination of values that may be (1) generated through target values and/or scaffolds, (2) identified from a trajectory of states that may be generated from an execution of the network, and/or (3) identified from various orientations of the graphical representation of the system. Results of applying the operation to the values may be reflected in the second set of information as one or more values for one or more states associated with the network.

It should be noted that that identifiers may be associated with the values in the first and/or second set of information. The identifiers may be used to distinguish the values and state associated with the values from values of one or more other states in the network and/or other networks, such as described above.

The above acts may be applied, for example, as follows. Referring to FIGS. 1, 2, 3, 4, and 12, TCE 200 may acquire a definition of an operation to be applied to a first state object associated with network 260 as illustrated in FIG. 4 (block 1220). The definition may be acquired from storage, such as primary storage 130 and/or secondary storage 140, via an interface, such as interface 500, or otherwise acquired.

The TCE 200 may apply the acquired operation to a first set of information, that may be contained in the first state object, to generate a second set of information (block 1230). As a result of applying the acquired operation, a number of scaffolds and/or target values contained in the first set of information may be different than the number of scaffolds and/or target values contained in the second set of information.

The TCE 200 may store the second set of information in a second state object for the network 260 (block 1240). The second state object may be contained in primary storage 130 and/or secondary storage 150 and the TCE 200 may store the second set of information by writing the information to the second state object. Also, the second state object may be stored separate from the network 260. For example, the second state object may be stored in a table contained in a database that is stored on secondary storage 150. The network 260 may be stored in a different table that may be contained in the database.

The TCE 200 may acquire information from the second state object (block 1250). The information may include some or all of the information in the second set of information. The TCE 200 may acquire the information by reading the information from the second state object. For example, the second state object may be stored in a table in a database as described above. The TCE 200 may access the table and read the information from the table.

The TCE 200 may identify a value of a state associated with an element in the network 260 based on the acquired information (block 1260). For example, suppose the acquired information includes a target value for a position state that may be associated with the wrist element in network 260. The TCE 200 may identify (e.g., generate) a value for the state based on the target value included in the acquired information.

The TCE 200 may establish a value of the state in the network 260 based on the identified value (block 1270). For example, using the above example, the TCE 200 may establish a value of the position state, associated with the wrist element in network 260, by setting the value of the position state to the identified value.

Figure 13A:
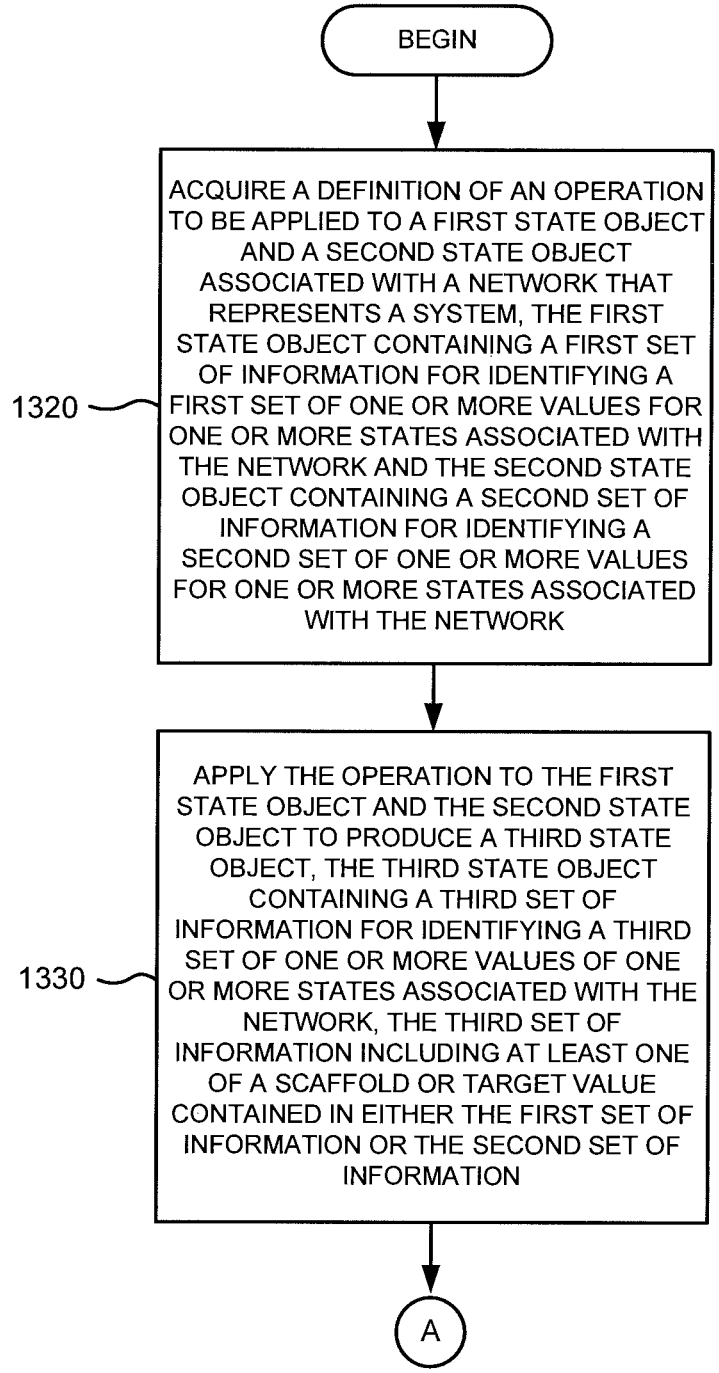
FIGS. 13A-B illustrate a flow chart of example acts that may be used to apply an operation to a first state object and a second state object associated with a network to generate a third state object for the network.
Figure 13B:
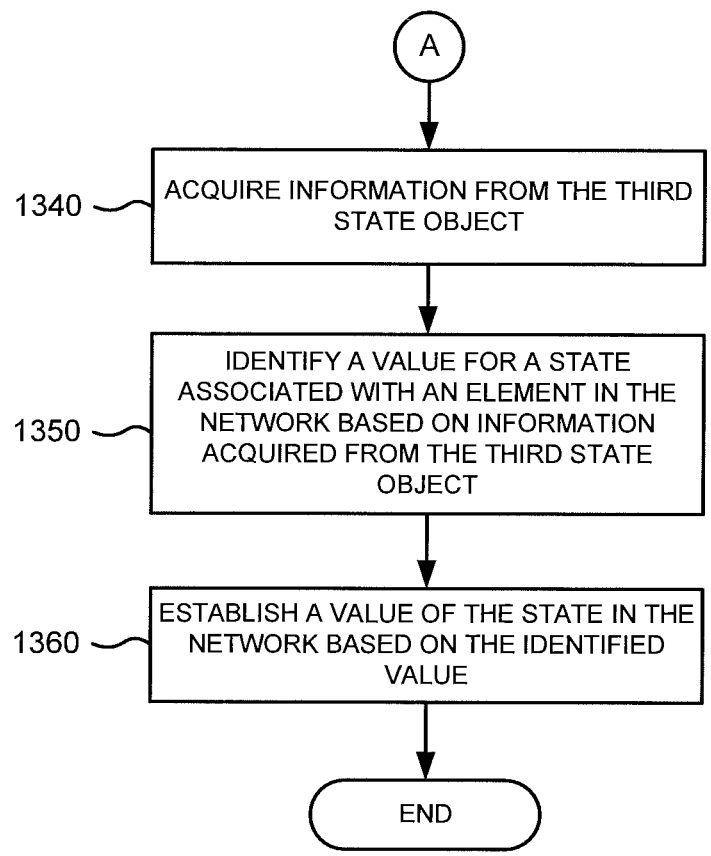

FIG. 13 illustrates a flow chart of example acts that may be used to apply an operation to a first state object and a second state object associated with a network to generate a third state object for the network. Referring to FIG. 13, at block 1320, a definition of an operation to be applied to the first state object is acquired. The operation may be acquired via an interface, such as interface 500, from a computer file, via a communications network, or some other source. The information may be acquired by reading the information. The first state object may contain a first set of information for identifying a first set of one or more values for one or more states associated with one or more elements in the network. The first set of information may include one or more targets, scaffolds, states, and/or other information. Likewise, the second state object may contain a second set of information for identifying a second set of one or more values for one or more states associated with one or more elements in the network. The second set of information may include one or more targets, scaffolds, values of low-level states, and/or other information.

At block 1330, the operation may be applied to the first state object and the second state object to produce (e.g., generate) a third state object. The third state object may contain (e.g., store) a third set of information for identifying one or more values for one or more states associated with the network. The third set of information may be produced by applying the operation to the first and second sets of information. The third set of information may include at least one of a scaffold or target that may be contained in either the first set of information or the second set of information. The number of targets and/or scaffolds contained in the third set of information may be different than the number of targets and/or scaffolds contained the first and/or second sets of information. Further, the third set of information may include one or more values of one or more states associated with the network. The one or more values may be produced by applying the operation to one or more values for one or more states contained in the first and/or second sets of information. One or more of the states may be low-level states associated with the network.

The operation may involve, for example, a logical intersection of the first set of information and the second set of information, a logical union of the first set of information and the second set of information, a merge of the first set of information and the second set of information, a combining of the first set of information and the second set of information, or some other operation that involves the first set of information and the second set of information. Moreover, the operation may be performed on values identified from the first set of information and/or the second set of information. In addition, the operation may involve excluding, from the third set of information, at least one of a scaffold or target associated with identifying a value for a state in the network. The state may be associated with a subsystem in the network. The excluded scaffold or target may be contained in the first and/or second sets of information.

At block 1340 (FIG. 13B), information in the third set of information is acquired from the third state object. The acquired information may include some or all of the information in the third set of information. The information may be acquired, for example, by reading the information from the third state object.

At block 1350, a value for a state associated with an element in the network may be identified based on information that is acquired from the third state object. The value may be identified such as described above. At block 1360, a value of the state is established based on the identified value. The value may be established as described above.

At block 1340, a state of the network may be established based on the second state object. For example, the second state object may contain a value of a state associated with the network. The value of the state in the network may be established based on the value of the state contained in the second state object by setting the value of the state in the network to the value contained in the second state object.

At block 1350, the network may be executed starting from the established state of the network. During execution, one or more of values associated with one or more states in the network may be identified. For example, a user may direct a TCE, such as TCE 200, to execute the network to simulate the system represented by the network. One or more values of one or more states in the network may be generated at various times during the simulation.

At block 1360, one or more values of one or more states may be established based on the identified one or more values. For example, using the above example, the user may direct the TCE to halt the simulation. The TCE may present one or more values for one or more states, associated with the network, that were generated during simulation on an interface, such as interface 500. The user may "browse" the values using the interface and select a one or more of the values. The one or more selected values may be used to establish values for one or more states in the network.

The above acts may be applied, for example, as follows. Referring to FIGS. 1, 2, and 13A-B, suppose that TCE 200 maintains a first state object and a second state object that contain information associated with network 260. Suppose the information includes a first set of information in the first state object and a second set of information in the second state object. Further, suppose the first and second sets of information include values of low-level states in network 260, scaffolds, and targets that may be used to identify values for states in network 260.

Now suppose that TCE 200 includes an interface 500 that may be used to specify a definition of an operation that is to be applied to information in the first and second state objects. TCE 200 may display the interface 500. A user may specify the definition of the operation via the interface 500. Suppose that the operation specified by the user involves merging the first set of information with the second set of information. The TCE 200 may acquire (e.g., read) the definition via the interface 500 (block 1320).

The TCE 200 may process the definition including applying (e.g., performing) the operation to the first set of information and the second set of information in the first and second state objects, respectively, to produce a third set of information for a third state object (block 1330). Now suppose, the first set of information contains a first scaffold and the second set of information contains a second scaffold, where the first and second scaffolds are different scaffolds. In applying the operation to the first and second sets of information, suppose the TCE 200 includes the first and second scaffolds in the third set of information and that the TCE 200 stores the third set of information in the third state object.

The TCE 200 may acquire (e.g., read) the first and second scaffolds from the third set of information contained in the third state object (block 1340). The TCE 200 may identify values of states associated with one or more elements in the network 260 based on the acquired first and/or second scaffold (block 1350). The TCE 200 may establish values of the states in the network 260 based on the identified value, such as described above (block 1360).

Following are examples of operations that may be applied to state objects at blocks 1230 and 1330.

A merge operation that may include combining two or more state objects that refer to the same system in non-conflicting ways to form a composite state object that encompasses the two or more state objects. For example, a first state object might be used to establish values of state in a network associated with a position of a base of a crane, represented by the network, and a second state object may be used to establish values of state in the network associated with a position of the crane's arm. The first state object may be merged with the second state object to form a composite state object that may be used to establish values of state associated with the crane's base and the crane's arm. Note that the merge operation may be generalized in various ways to handle cases when there are conflicts, e.g. by giving priority to one of the input objects.

An intersection operation that may include combining two or more state objects into a state object that is, for example, a specific state object that is consistent with all of the combined state objects. This operation may be useful in factoring out common pieces of state, when arranging states in a hierarchy.

An interpolation operation that may include combining two or more state objects into a state object that interpolates among them. The interpolation may encompass many possible schemes for blending different parts of the state objects. The interpolation may include interpolating values of low-level states as well as scaffolds and targets.

A pruning operation may include removing all parts of a state object that refer to a particular subsystem of the model. Pruning may also include removing targets from, for example, prismatic joints or from joints that may have names that match a certain regular expression pattern. Pruning may involve a single state object or multiple state objects.

A simulation of system. Here, for example, the simulation may be provided with a starting state. The simulation may return a new state that may be a final state after the simulation. The new state may be saved in a state object.

A domain-specific transformation operation that may include applying one or more types of domain-specific transformations to state objects. For example, in a mechanical domain, an at-rest transformation might convert a first state object into a second state object that holds information that may be used to set positions of all bodies, represented in the first state object, to the same positions represented in the first state object but with a velocity of zero. This transformation may be useful, for example, in establishing a starting point for a simulation of a system. Another example may be an equilibrium transformation which may involve generating a state object that contains information that reflects a lowest energy (equilibrium) state of a system. For example, suppose a first state object contains information that specifies that two ends of a chain are connected to a ceiling and the state of other links of the chain are unspecified. The equilibrium transformation may be used to generate a second state object which may contain information that may direct the chain to hang at rest in, for example, a catenary curve.

Figure 14:
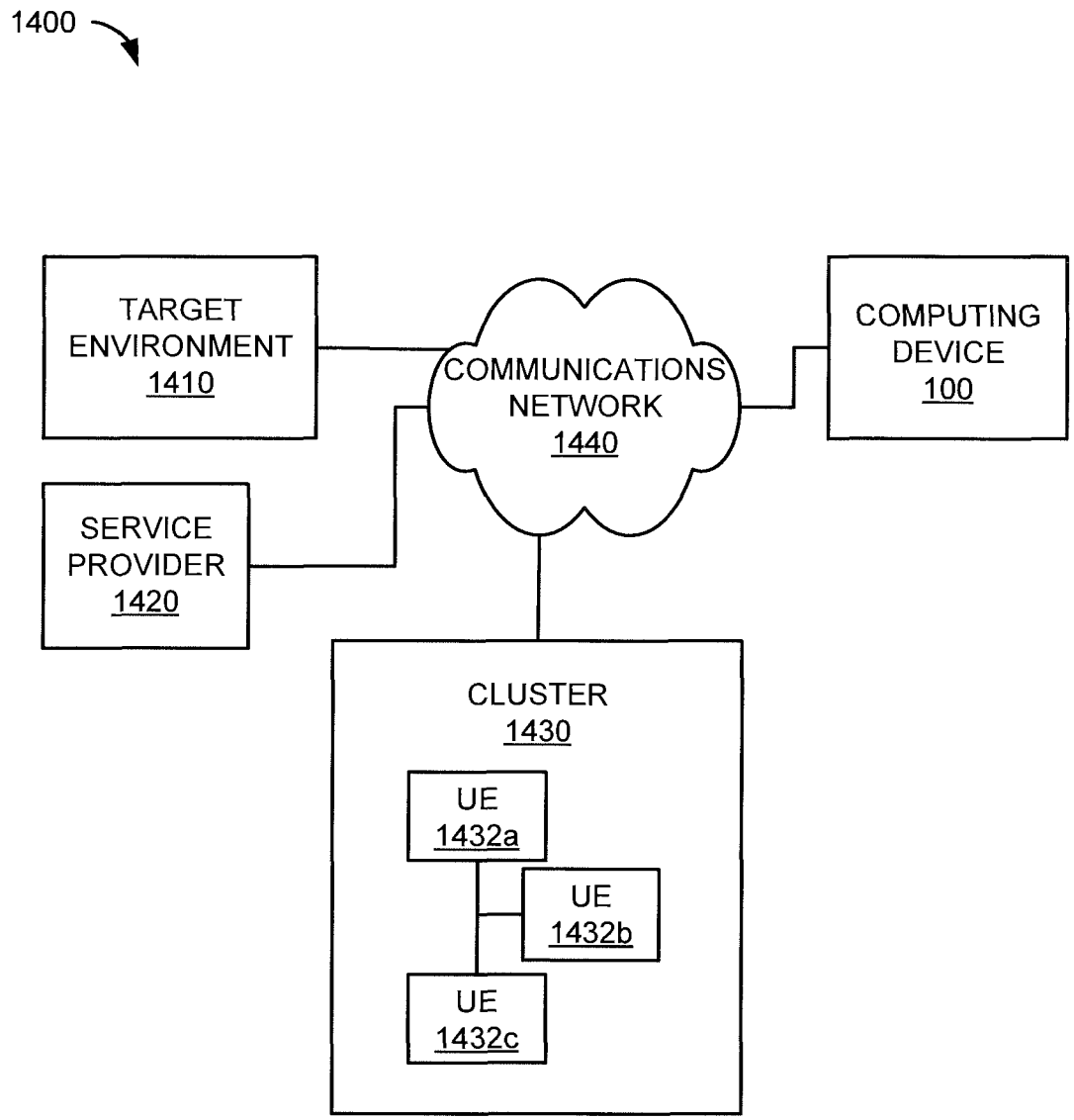
FIG. 14 illustrates a block diagram of an example of a distributed computing environment that may implement one or more embodiments of the invention.

One or more embodiments of the invention may be implemented in a distributed environment. FIG. 14 illustrates an example of a distributed environment 1400 that may implement one or more embodiments of the invention. Referring to FIG. 14, environment 1400 may contain various components including computing device 100, target environment 1410, service provider 1420, cluster 1430, and communications network 1440. Note that the distributed environment 1400 is just one example of a distributed environment that may be used with one or more embodiments of the invention. Other distributed environments that may be used with one or more embodiments of the invention may contain more components or fewer components than illustrated in FIG. 14. Moreover, the components in the distributed environments may be arranged differently than the arrangement shown in FIG. 14. In addition, the distributed environments may implement various "cloud computing" frameworks.

Details of computing device 100 were described above with respect to FIG. 1. In distributed environment 1400, computing device 100 may, among other things, exchange information (e.g., data) with other components in the communications network 1440 (e.g., target environment 1410, service provider 1420, and cluster 1430). Computing device 100 may interface with the communications network 1440 via a communication interface 180.

Target environment 1410 may be configured to interpret and/or execute, for example, one or more embodiments of the invention, which may be generated in or otherwise made available to the distributed environment 1400. The communications network 1440 may include digital and/or analog aspects. Information exchanged in communications network 1440 may include machine-readable information having a format that may be adapted for use, for example, in the communications network 1440 and/or with one or more components in the communications network 1440.

For example, the information may be encapsulated in one or more packets that may be used to transfer the information through the communications network 1440. Information may be exchanged between components in the communications network 1440 using various communication protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.11, or other communication protocol.

The communications network 1440 may comprise various network devices, such as gateways, routers, switches, firewalls, servers, repeaters, address translators, etc. Some or all of the communications network 1440 may be wired (e.g., using wired conductors, optical fibers) and/or wireless (e.g., using free-space optical (FSO), radio frequency (RF), acoustic transmission paths). Portions of the communications network 1440 may include a substantially open public network, such as the Internet. Portions of the communications network 1440 may include a more restricted network, such as a private corporate network or virtual private network (VPN). It should be noted that implementations of communications networks and/or devices operating on communications networks described herein are not limited with regards to, for example, information carried by the communications networks, protocols used in the communications networks, and/or the architecture/configuration of the communications networks.

Cluster 1430 may include a number of units of execution (UEs) 1432 that may execute or interpret one or more embodiments of the invention or portions thereof on behalf of computing device 100 and/or another component, such as service provider 1420. The UEs 1432 may reside on a single device or chip or on multiple devices or chips. For example, the UEs 1432 may be implemented in a single ASIC or in multiple ASICs. Likewise, the UEs 1432 may be implemented in a single computer system or multiple computer systems. Other examples of UEs 1432 may include, for example, some combination of FPGAs, CPLDs, ASIPs, processors, multiprocessor systems-on-chip (MPSoCs), graphic processing units, and/or microprocessors. The UEs 1432 may be configured to perform operations on behalf of another component in the distributed environment 1400. For example, in an embodiment, the UEs 1432 are configured to execute portions of code associated with the programming environment 200. Here, the programming environment 200 may dispatch certain activities pertaining to one or more embodiments of the invention to the UEs 1432 for execution. The service provider 1420 may configure cluster 1430 to provide, for example, the above-described services to computing device 100 on a subscription basis (e.g., via a web service).

The foregoing description of embodiments is intended to provide illustration and description, but is not intended to be exhaustive or to limit the invention to the precise form disclosed. Modifications and variations are possible in light of the above teachings or may be acquired from a practice of the invention. For example, while a series of acts has been described above with respect to FIGS. 8A-B, 9A-B, 10, 11A-B, 12, and 13A-B, the order of the acts may be modified in other implementations. Further, non-dependent acts may be performed in parallel. Also, the term "user", as used herein, is intended to be broadly interpreted to include, for example, a computing device (e.g., a workstation) or a user of a computing device, unless otherwise stated.

It will be apparent that one or more embodiments, described herein, may be implemented in many different forms of software and hardware. Software code and/or specialized hardware used to implement embodiments described herein is not limiting of the invention. Thus, the operation and behavior of embodiments were described without reference to the specific software code and/or specialized hardware—it being understood that one would be able to design software and/or hardware to implement the embodiments based on the description herein.

Further, certain embodiments of the invention may be implemented as logic that performs one or more functions. This logic may be hardware-based, software-based, or a combination of hardware-based and software-based. Some or all of the logic may be stored in one or more tangible computer-readable storage media and may include computer-executable instructions that may be executed by processing logic, such as processing logic 120. The computer-executable instructions may include instructions that implement one or more embodiments of the invention. The tangible computer-readable storage media may be volatile or non-volatile and may include, for example, flash memories, dynamic memories, removable disks, and non-removable disks.

No element, act, or instruction used herein should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

It is intended that the invention not be limited to the particular embodiments disclosed above, but that the invention will include any and all particular embodiments and equivalents falling within the scope of the following appended claims.

What is claimed is:

1. A method comprising:
   receiving, using a computing device, a network including a plurality of elements,
      the network representing a physical system,
      the plurality of elements representing one or more entities of the physical system, and
      the plurality of elements being associated with a plurality of states;
   acquiring, using the computing device, a scaffold for the network,
      the scaffold specifying information regarding a position for a particular element, of the plurality of elements of the network, within the physical system,
      the scaffold including a high-level definition of a plurality of desired states for one or more elements of the plurality of elements, and
      the one or more elements including the particular element;
   simulating, using the computing device, at least a portion of the physical system using at least a portion of the network;
   modifying, using the computing device, at least one of the plurality of elements, of the network, to generate a modified network;
   determining, using the computing device, whether the plurality of desired states defined by the scaffold are applicable to the modified network;
   establishing, using the computing device, one or more values of one or more states associated with one or more elements of the modified network based on the when the plurality of desired states defined by the scaffold are applicable to the modified network;
providing, using the computing device and for display, a presentation of a first geometric configuration of the modified network;
receiving, using the computing device, an input that includes information related to dragging the presentation of the first geometric configuration;
providing, using the computing device and for display, a presentation of a second geometric configuration based on the input; and
applying, using the computing device, the scaffold to the second geometric configuration.

2. The method of claim 1,
where the scaffold is stored in a first storage entity,
where the network is stored in a second storage entity, and
where the second storage entity is different from the first storage entity.

3. The method of claim 2, where the first storage entity is one of a file, a record, or a database table.

4. The method of claim 1, further comprising:
storing the one or more established values in a state object.

5. The method of claim 1, further comprising:
providing a user interface element for display; and
receiving the information regarding the position of the particular element via the user interface element.

6. One or more non-transitory computer-readable media storing instructions, the instructions comprising:
one or more instructions that, when executed by at least one processor, cause the at least one processor to:
receive a network including a plurality of elements,
the network representing a physical system,
the plurality of elements representing one or more entities of the physical system, and
the plurality of elements being associated with a plurality of states;
acquire, through a graphical user interface, a scaffold for the network,
the scaffold specifying information regarding a position for a particular element of the plurality of elements of the network,
the scaffold including a high-level definition of a plurality of desired states for one or more elements of the plurality of elements, and
the one or more elements including the particular element;
simulate at least a portion of the physical system using at least a portion of the network;
modify at least one of the plurality of elements, of the network, to generate a modified network;
acquire the scaffold from a state object;
determine whether the plurality of desired states defined by the scaffold are applicable to the modified network;
identify a plurality of values for a plurality of states associated with one or more elements of the modified network based on the scaffold when the plurality of desired states defined by the scaffold are applicable to the modified network;
provide, for display, a presentation of a first geometric configuration of the modified network;
receive an input that includes information related to dragging the presentation of the first geometric configuration;
provide, for display, a presentation of a second geometric configuration based on the input; and
apply the scaffold to the second geometric configuration.

7. The one or more non-transitory computer-readable media of claim 6,
where the scaffold is stored in a first storage entity,
where the network is stored in a second storage entity, and
where the second storage entity is different from the first storage entity.

8. The one or more non-transitory computer-readable media of claim 7, where at least one of the first storage entity or the second storage entity is one of a file, a record, or a database table.

9. The one or more non-transitory computer-readable media of claim 6, where the instructions further comprise:
one or more instructions that, when executed by the at least one processor, cause the at least one processor to:
store the plurality of values in the state object that stores the scaffold.

10. The one or more non-transitory computer-readable media of claim 6, where the one or more instructions to modify the network to generate the modified network include:
one or more instructions that, when executed by the at least one processor, cause the at least one processor to:
receive an instruction to remove a different element, of the plurality of elements, from the network,
the at least one of the plurality of elements including the different element; and
remove the different element from the network to generate the modified network.

11. A system comprising:
one or more processors to:
receive a network that includes a plurality of elements,
the network representing a physical system, and
the plurality of elements representing one or more entities of the physical system;
simulate at least a portion of the physical system using at least a portion of the network;
modify at least one of the plurality of elements, of the network, to generate a modified network;
acquire a scaffold from a state object,
the scaffold specifying information regarding a position for a particular element of the plurality of elements, and
the scaffold including a high-level definition of a plurality of desired states for at least a portion of the plurality of elements that include the particular element;
determine whether the plurality of desired states defined by the scaffold acquired from the state object are applicable to the modified network;
establish one or more values of one or more states associated with one or more elements, of the plurality of elements, of the modified network based on the scaffold acquired from the state object when the plurality of desired states defined by the scaffold, acquired from the state object, are applicable to the modified network;
provide, for display, a presentation of a first geometric configuration of the modified network;
receive an input that includes information related to dragging the presentation of the first geometric configuration;
provide, for display, a presentation of a second geometric configuration based on the input; and
apply the scaffold to the second geometric configuration.

12. The system of claim 11, where the one or more processors are further to:
store the one or more values in the state object.

13. The system of claim 11, where the state object is stored separately from the network.

14. The system of claim 11, where the one or more processors are further to:
provide a text box for display;
receive the information regarding the position of the particular element via the text box; and
define the scaffold based on the information regarding the position of the particular element.

15. A method comprising:
receiving a network that includes a plurality of elements,
the network representing a physical system,
the plurality of elements representing one or more entities of the physical system,
the plurality of elements being associated with a plurality of states, and
the receiving the network being performed by a computing device,
acquiring a scaffold for the network from a state object,
the scaffold specifying information regarding a position of a particular element of the plurality of elements, and
the acquiring the scaffold being performed by the computing device;
simulating at least a portion of the physical system using at least a portion of the network,
the simulating the at least the portion of the physical system being performed by the computing device;
modifying at least one of the plurality of elements, of the network, to generate a modified network,
the modifying the at least one of the plurality of elements being performed by the computing device;
determining that a plurality of desired states defined by the scaffold are applicable to the modified network,
the determining being performed by the computing device;
establishing a value of a state associated with an element of the modified network based on determining that the plurality of desired states defined by the scaffold, acquired from the state object, are applicable to the modified network,
the establishing the value of the state being performed by the computing device;
providing, for display, a presentation of a first geometric configuration of the modified network,
the providing the presentation of the first geometric configuration being performed by the computing device;
receiving an input that includes information related to dragging the presentation of the first geometric configuration,
the receiving the input being performed by the computing device;
providing, for display, a presentation of a second geometric configuration based on the input,
the providing the presentation of the second geometric configuration being performed by the computing device; and
applying the scaffold to the second geometric configuration,
the applying the scaffold to the second geometric configuration being performed by the computing device.

16. The method of claim 15,
where the state object is stored in a first storage entity, and
where the network is stored in a second storage entity that is different from the first storage entity.

17. The method of claim 15, where modifying the network to generate the modified network includes:
receiving an instruction to remove a different element, of the plurality of elements, from the network,
the at least one of the plurality of elements including the different element; and
removing the different element from the network to generate the modified network.

18. The method of claim 15, where the scaffold indicates the position of the element in relation to another element of the plurality of elements.

19. The method of claim 15, further comprising:
providing a text box for display;
receiving the information regarding the position of the particular element via the text box; and
defining the scaffold based on the information regarding the position of the particular element.

\* \* \* \* \*